United States Patent
Kinjo et al.

(10) Patent No.: US 9,291,682 B2
(45) Date of Patent: Mar. 22, 2016

(54) DEGRADATION STATE ESTIMATING METHOD AND DEGRADATION STATE ESTIMATING APPARATUS

(71) Applicant: Panasonic Corporation, Osaka (JP)

(72) Inventors: Tatsuto Kinjo, Osaka (JP); Seiya Miyazaki, Hyogo (JP); Takahiro Kudoh, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 177 days.

(21) Appl. No.: 14/117,491

(22) PCT Filed: Mar. 27, 2013

(86) PCT No.: PCT/JP2013/002070
§ 371 (c)(1),
(2) Date: Nov. 13, 2013

(87) PCT Pub. No.: WO2013/145734
PCT Pub. Date: Oct. 3, 2013

(65) Prior Publication Data
US 2014/0333265 A1    Nov. 13, 2014

(30) Foreign Application Priority Data

Mar. 30, 2012  (JP) .................................. 2012-081267
Mar. 30, 2012  (JP) .................................. 2012-081373

(51) Int. Cl.
*H02J 7/00* (2006.01)
*G01R 31/36* (2006.01)

(52) U.S. Cl.
CPC .......... *G01R 31/3679* (2013.01); *G01R 31/362* (2013.01); *G01R 31/3624* (2013.01); *G01R 31/3651* (2013.01); *H02J 7/007* (2013.01)

(58) Field of Classification Search
CPC ............. G01R 31/3679; G01R 31/362; G01R 31/3624; G01R 31/3651; H02J 7/007
USPC ......................................................... 320/134
See application file for complete search history.

(56) References Cited

U.S. PATENT DOCUMENTS

| 6,563,318 B2 | 5/2003 | Kawakami et al. |
| 2002/0109506 A1 | 8/2002 | Kawakami et al. |
| 2010/0277132 A1* | 11/2010 | Hara et al. ................... 320/163 |

FOREIGN PATENT DOCUMENTS

| JP | 2005-274280 | 10/2005 |
| JP | 2007-187533 | 7/2007 |
| JP | 2008-252960 | 10/2008 |
| JP | 2009-250796 | 10/2009 |
| JP | 2011-64471 | 3/2011 |
| JP | 2011-257411 | 12/2011 |

OTHER PUBLICATIONS

International Search Report issued Jul. 2, 2013 in corresponding International Application No. PCT/JP2013/002070.

* cited by examiner

*Primary Examiner* — Vuthe Siek
(74) *Attorney, Agent, or Firm* — Wenderoth, Lind & Ponack, L.L.P.

(57) ABSTRACT

Provided is a degradation state estimating method which decreases degradation in a secondary battery caused by estimating the degradation state. The degradation state estimating method is a method of estimating the degradation state of a secondary battery, includes:
controlling application of current to the secondary battery; obtaining, as measurement information, at least a voltage value of the secondary battery measured while the current is flowing through the secondary battery; and estimating the degradation state of the secondary battery, based on a model for estimating the degradation state of the secondary battery and the measurement information obtained in the obtaining. In the controlling, at least one of a current value of the current and duration during which a predetermined current value is maintained is determined according to a provisional degradation state of the secondary battery.

20 Claims, 22 Drawing Sheets

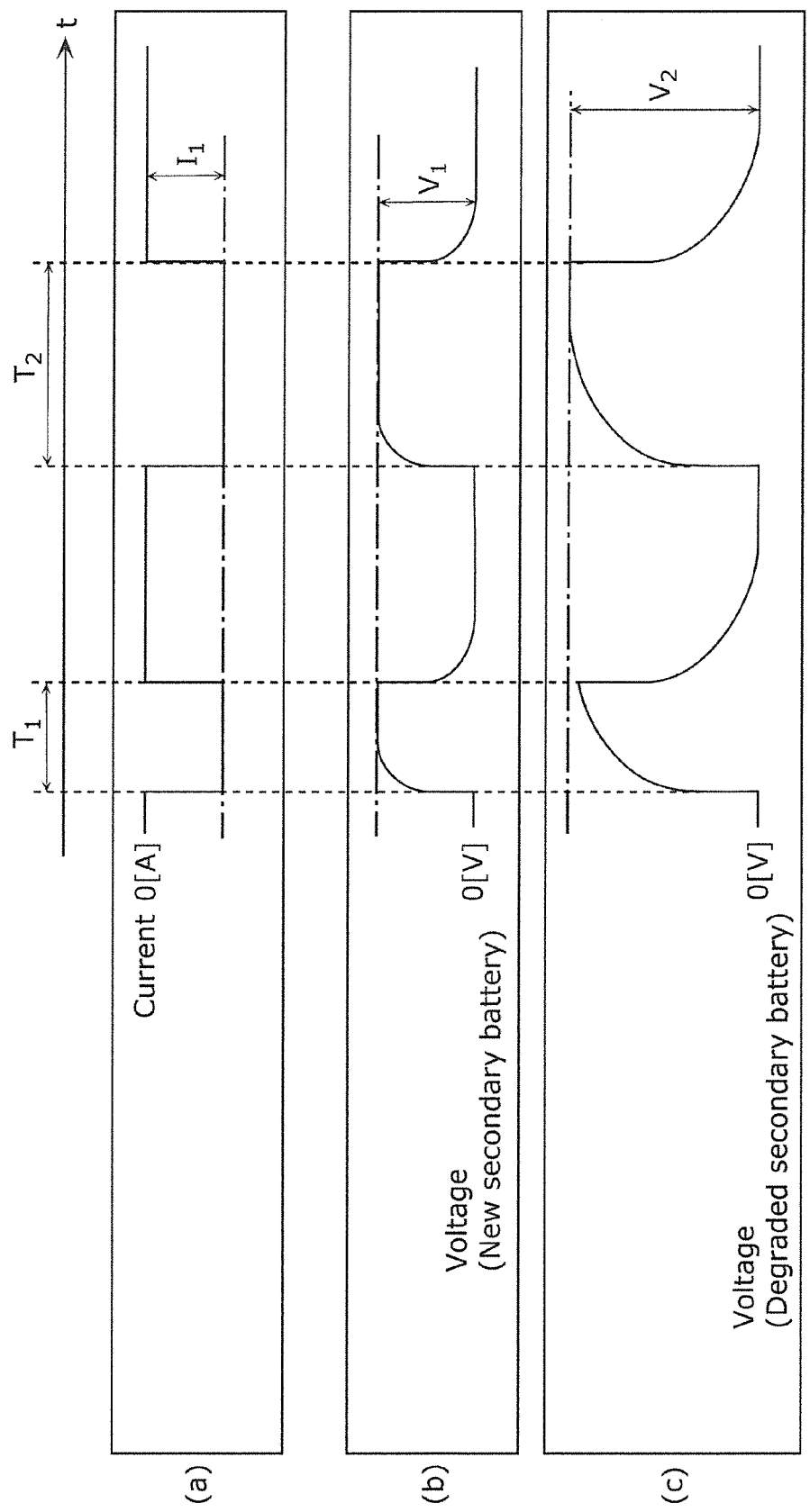

DEGRADATION STATE ESTIMATING METHOD AND DEGRADATION STATE ESTIMATING APPARATUS

TECHNICAL FIELD

The present invention relates to methods of estimating degradation states. In particular, the present invention relates to a method of estimating the degradation state of a secondary battery.

BACKGROUND ART

Along with an increase in capacity of secondary batteries in recent years, there is a demand for storage battery systems which allow accurate estimation of degradation states of the secondary batteries (see, for example, Patent Literature (PTL) 1).

CITATION LIST

Patent Literature

[PTL 1]
Japanese Unexamined Patent Application Publication No. 2009-250796
[PTL 2]
Japanese Unexamined Patent Application Publication No. 2005-274280

SUMMARY OF INVENTION

Technical Problem

However, the method of diagnosing degradation disclosed in PTL 1 has a problem in that performing degradation diagnosis accelerates the degradation of a target secondary battery.

In view of this, the present invention has an object to provide an apparatus which estimates degradation state, which can decrease degradation in the secondary battery caused by estimating the degradation state.

Solution to Problem

An aspect of the degradation state estimating apparatus according to the present invention is a degradation state estimating method of estimating a degradation state of a secondary battery. The method includes: controlling application of a current to the secondary battery; obtaining, as measurement information, at least a voltage value of the secondary battery measured while the current is flowing through the secondary battery; and estimating the degradation state of the secondary battery, based on a model for estimating the degradation state of the secondary battery and the measurement information obtained in the obtaining. In the controlling, at least one of a current value of the current to be applied to the secondary battery and duration during which the current is maintained at a predetermined current value is determined according to a provisional degradation state of the secondary battery.

The present invention can be implemented not only as such an estimating method, but also as a degradation state estimating apparatus including, as units, characteristic steps included in the estimating method, or as a program causing a computer to execute such steps. Needless to say, such a program may be distributed over a recording medium such as a compact disc read only memory (CD-ROM) or a transmission medium such as the Internet.

Furthermore, the present invention may be implemented as a semiconductor integrated circuit (LSI) which includes part or all of the functions of the estimating method, or may be implemented as a storage battery system including the degradation state estimating apparatus.

Advantageous Effects of Invention

According to the present invention, it is possible to provide a method of estimating degradation state which decreases degradation in the secondary battery caused by estimating the degradation state.

BRIEF DESCRIPTION OF DRAWINGS

FIG. 5 shows relationship between the degradation states of storage batteries and terminal voltage.

Figure 1:
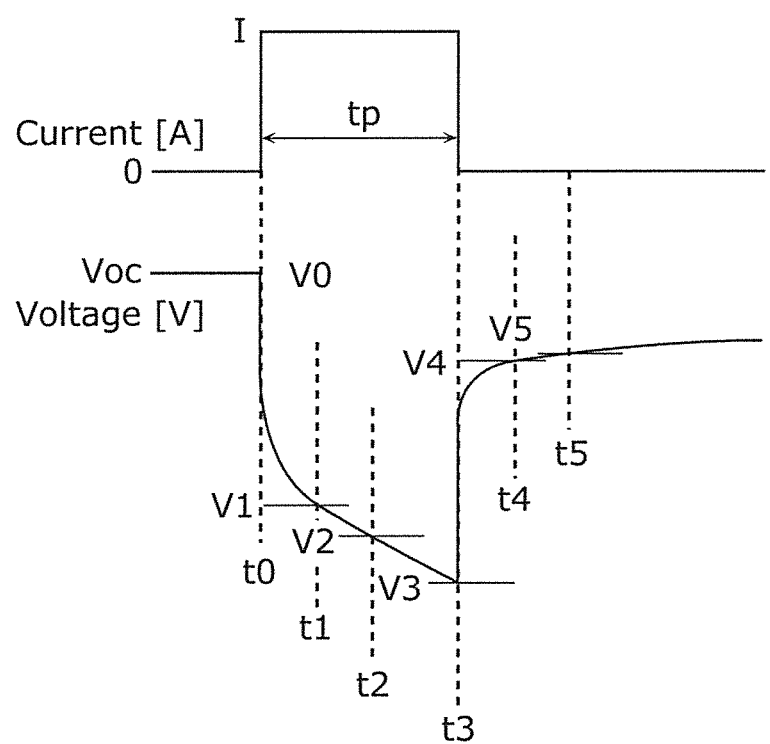
FIG. 1 is a diagram schematically illustrating a conventional technique.

DESCRIPTION OF EMBODIMENTS (Underlying Knowledge Forming Basis of the Present Invention)

In relation to the storage battery system disclosed in the Background Art section, the inventors have found the following first problem:

In recent years, widespread deployment of storage battery systems including large-capacity secondary batteries (also referred to as storage batteries) which are provided for consumer usage are expected. Furthermore, along with the storage battery systems, electric vehicles (EVs) including large-capacity secondary batteries are becoming more common among standard homes.

In general, a secondary battery degrades by repeatedly being charged and discharged (cycle degradation). Furthermore, the secondary battery degrades as the length of the operating time period of the secondary battery increases (calendar degradation). Hence, it is necessary to estimate the degradation state of the secondary battery as accurately as possible to extend the life of the expensive secondary battery for efficient use.

As a quantified index of degradation state of a secondary battery, an index referred to as state of health (SOH) is known. The SOH indicates the degradation state of a secondary battery by using values of 0 to 100. When the degradation state of the secondary battery is 0 (that is, when the secondary battery is new), the SOH indicates a value of 100. A decreasing value of SOH indicates further degradation. The storage battery system is capable of, for example, presenting a message prompting a user to replace the secondary battery, by estimating the SOH. Furthermore, it is possible to perform output control of a secondary battery to reduce burden of the degraded secondary battery.

Examples of the method of estimating the SOH include a coulomb counting method, an internal resistance measuring method, and an AC impedance measuring method. In the coulomb counting method, current values are integrated and total current between full charge and full discharge is measured. In the internal resistance measuring method, internal resistance is measured from current values and voltage values, and SOH is estimated from a map of the internal resistance, temperature, and state of charge (SOC) prepared in advance. In the AC impedance measuring method, AC voltage of different frequencies are applied to calculate parameters of an equivalent circuit.

Furthermore, as disclosed in PTL 1, the degradation state may also be estimated by applying a constant current pulse to a storage battery and calculating parameters of an equivalent circuit of the storage battery from time series variation in voltage at the time of the application. In one embodiment of the present invention, this method is used. A merit of the method is that the SOH can be measured within the storage battery system through charging and discharging, without requiring a dedicated hardware such as dedicated measurement equipment or a radio frequency power supply apparatus. Hence, it is possible to estimate the SOH while the storage battery is actually being used, instead of measurement of the SOH by an expert as in the conventional technique.

More specifically, as shown in FIG. 1, pulse current having a constant amplitude I is applied to a target secondary battery. Here, voltage Voc of the secondary battery is measured at two or more time points. For example, in FIG. 1, Voc is measured at six time points that are from time t0 to t5. Subsequently, the degradation state of the secondary battery is diagnosed from the voltage values at respective time points.

However, the terminal voltage of the secondary battery increases with an increase in the value of measuring pulse current I that is applied to the secondary battery for degradation state diagnosis. This accelerates degradation in the secondary battery. On the other hand, when the value of the pulse current I applied to the secondary battery decreases, the terminal voltage of the secondary battery also decreases. As a result, it is possible to decrease degradation in the secondary battery, but accuracy in estimation of the degradation state decreases. This is because accurate estimation of the degradation state of the secondary battery requires the amount of voltage change that is greater than or equal to a predetermined value.

In other words, use of the method of diagnosing degradation state disclosed in PTL 1 includes the first problem of a trade-off between decrease in degradation of the secondary battery and accuracy in estimation of the degradation state.

Furthermore, the inventors also found a second problem as below.

The conventional storage battery system disclosed in PTL 1 uses a dedicated mode for estimating the degradation state of a secondary battery. In the degradation state estimation mode, measuring current is applied to the secondary battery just for estimating the degradation state. However, while the measuring current flows through the secondary battery, it is not possible to control charging and discharging of the storage battery, such as power supply to a load apparatus, which is necessary for the original purpose of the storage battery system. Furthermore, applying measuring current to the storage battery may accelerate degradation in the secondary battery.

Other than the measuring current, current to be charged or discharged for the original purpose flows through the storage battery. Here, examples of usage of the storage battery for the original purpose include (i) the case where a storage battery at a consumer charges inexpensive nighttime power and discharges the charged power at daytime, (ii) the case where surplus power generated at a power generation facility provided at a consumer is charged, and the charged surplus power is caused to flow back at hours during which the price for power sold is high, and (iii) the case where the storage battery is used as a buffer for power output from a power generation facility which uses natural energy that has fluctuating output.

In light of this, the inventors have arrived at a control apparatus which is capable of estimating the degradation state of the storage battery by measuring the current flowing through the storage battery for the original purpose and the terminal voltage at the time. More specifically, the control apparatus according to an aspect of the present invention is capable of estimating the SOH that is a value indicating the degradation state of the storage battery, as well as controlling charging and discharging of the storage battery based on instruction values.

The inventors have found the following problems in achieving such a control apparatus.

In general, it is preferable that the length of an output period of a control signal for a storage battery is decreased as much as possible, to increase the accuracy of charging and discharging control of the storage battery. On the other hand, the time constant for voltage change increases as degradation of the storage battery progresses. More specifically, as the degradation progresses, when the current flowing through the storage battery changes, the change speed of the terminal voltage corresponding to the current change slows down. Accordingly, if the length of the output period of the control signal is not increased for the storage battery whose degradation has been progressed, accuracy in measuring voltage decreases. As a result, accuracy in estimation of SOH decreases.

As described above, in order to estimate the degradation state of the storage battery by measuring the current flowing through the storage battery for the original purpose and the terminal voltage at the time, in stead of measuring the measuring current, the output period of the control signal for the storage battery needs to be appropriately adjusted according to the degradation state of the storage battery, which is the second problem.

In order to solve such problems, the degradation state estimating method according to an aspect of the present invention is a degradation state estimating method of estimating a degradation state of a secondary battery. The method includes: controlling application of a current to the secondary battery; obtaining, as measurement information, at least a voltage value of the secondary battery measured while the current is flowing through the secondary battery; and estimating the degradation state of the secondary battery, based on a model for estimating the degradation state of the secondary battery and the measurement information obtained in the obtaining. In the controlling, at least one of a current value of the current to be applied to the secondary battery and duration during which the current is maintained at a predetermined current value is determined according to a provisional degradation state of the secondary battery.

Generally, a secondary battery has a property in that as degradation progresses, the amount of change in terminal voltage at the time of flow of current with the same value increases. More specifically, when the same current flows through a new battery and an old battery, the old battery have a greater voltage change.

In view of this, in the present aspect, at least one of the current value of current applied to a secondary battery and duration is varied according to the degradation state of the secondary battery. Accordingly, compared to the case where current having the same value is always applied to the secondary battery or the case where current having a predetermined current value is applied to the secondary battery over the same duration, it is possible to decrease degradation in the secondary battery without decreasing the measurement accuracy, in the case where, for example, lower current is applied to a further degraded secondary battery or current is applied to the further degraded secondary battery over a longer duration.

Furthermore, it may be that the degradation state estimating method further includes obtaining degradation information which is information indicating the provisional degradation state of the secondary battery, and that in the controlling, as the degradation of the secondary battery indicated by the degradation information progresses, at least one of (i) a first control for decreasing the current value of the current and (ii) a second control for increasing a length of the duration, is performed.

With this, it is possible to decrease degradation in the secondary battery while maintaining accuracy in estimation of the SOH, by performing at least one of (i) a first control for decreasing a current value and (ii) a second control for increasing duration, as the degradation of the secondary battery progresses.

More specifically, it may be that in the obtaining of degradation information, cycle information indicating a total number of times the secondary battery is charged or discharged is obtained as the degradation information, and that in the controlling, at least one of the first control and the second control is performed as the total number of times the secondary battery is charged or discharged increases.

With this, it is possible to easily estimate the degradation state of the secondary battery by using the number of cycles of the secondary battery.

Furthermore, it may be that in the obtaining of degradation information, an operating time period of the secondary battery is obtained as the degradation information, and that in the controlling, at least one of the first control and the second control is performed as a length of the operating time period of the secondary battery increases.

With this, it is possible to easily estimate the degradation state of the secondary battery by using the operating time period of the secondary battery.

Furthermore, it may be that in the estimating, a state of health (SOH) is further estimated using the model and the measurement information, the SOH being a value indicating the degradation state. The degradation state estimating method may further include storing the estimated SOH in a storage unit. It may be that in the controlling, a first SOH stored in the storage unit is compared with a second SOH estimated in the estimating subsequent to the first SOH, when the second SOH is greater than the first SOH, at least one of (i) a control for increasing the current value of the current and (ii) a control for decreasing the length of the duration is performed, and when the second SOH is less than the first SOH, at least one of (i) a control for decreasing the current value of the current and (ii) a control for increasing the length of the duration is performed.

With this, it is possible to determine at least one of the current value of the current and the duration, from transition of the previously estimated SOHs.

Furthermore, it may be that in the controlling, the current value of the current is determined to cause an amount of voltage change in the secondary battery to approach a predetermined reference value.

With this, it is possible to apply minimum necessary voltage to the secondary battery according to the resolution of the sensor for measuring voltage of the secondary battery. Accordingly, it is possible to further decrease degradation in the secondary battery without decreasing accuracy in estimation of the SOH.

Furthermore, it may be that in the controlling, a pulse current is applied to the secondary battery as the current.

Furthermore, it may be that the degradation state estimating method further includes: obtaining an instruction value which defines a current value of a charge and discharge current which is a current required for charging and discharging of the secondary battery; and determining, based on a time constant for a voltage change in the secondary battery, a threshold for a period for determining the duration. It may be that in the controlling, (i) the current value of the charging and discharging current of the secondary battery is determined as the current value of the current, based on the instruction value obtained in the obtaining of an instruction value, and a period during which the current value of the charging and discharging current is maintained is determined as the duration, based on the threshold determined in the determining of a threshold, and (ii) charging and discharging of the secondary battery is controlled at the determined current value of the current and over the determined duration, in the obtaining of at least a voltage value, at least a voltage value of the secondary battery is obtained as the measurement information, the voltage value of the secondary battery being measured while charging and discharging of the secondary battery is being controlled in the controlling, and in the controlling, the length of the duration is determined to exceed the threshold.

With this, it is possible to determine the current value and the duration of current for controlling charging and discharging of the secondary battery while maintaining accuracy in estimation of the SOH, and output the determined current value and duration to the secondary battery. As a result, it is possible to estimate the degradation state of the secondary battery while continuously controlling charging and discharging of the secondary battery.

Furthermore, it may be that in the obtaining of an instruction value, the instruction value is obtained for each first period, in the controlling, when the threshold is less than the first period, a length of the first period is determined as the length of the duration, and when the threshold is greater than or equal to the first period, the length of the duration is determined to be greater than or equal to the threshold.

With this, it is possible to determine the current value and the duration of current for controlling charging and discharging of the secondary battery while maintaining accuracy in estimation of the SOH, based on the obtained instruction value. Accordingly, it is possible to estimate the degradation state of the secondary battery while controlling the secondary battery appropriately.

Furthermore, it may be that in the controlling, a plurality of sets are further determined based on an amount of change, made in a second period, in a plurality of the instruction values which are obtained in the second period, each of the sets including the current value of the current and the duration.

For example, it may be that in the controlling, the sets are determined such that an amount of change, made in the second period, in current values of the charging and discharging current determined by the instruction values obtained in the second period is equal to an amount of change, made in the second period, in current values of the charging and discharging current in the sets determined according to the instruction values.

With this, it is possible to determine plural sets such that the slope of the instruction value matches the slope of the plural sets. Accordingly, it is possible to determine the current value and the duration more appropriately.

Furthermore, it may be that in the controlling, when a difference between a first current value and a second current value is less than a predetermined reference value, the first current value and the second current value are determined such that the difference is greater than or equal to the predetermined reference value and a sum of the first current value and the second current value is less than the predetermined reference value, the first current value and the second current value being current values of the current to be determined consecutively.

With this, even when receiving an instruction value which does not have current change necessary for estimating the degradation state of the secondary battery, it is possible to accurately estimate the degradation state by determining a first current value and a second current value such that the instruction value has a current change necessary for estimating the degradation state.

Furthermore, it may be that in the controlling, the current value is determined such that an area obtained by integrating a differential waveform in the second period approaches 0, the differential waveform being a difference between a waveform indicating a plurality of the instruction values obtained consecutively in a predetermined period and a waveform indicating a plurality of the current values to be determined according to the instruction values.

With this, it is possible to minimize quantization error caused when making plural instruction values to one estimation value. Accordingly, it is possible to perform, on the secondary battery, charging and discharging control which is closer to the control intended by the instruction value.

These general and specific aspects may be implemented using a system, a method, an integrated circuit, a computer program, or a recording medium, or any combination of systems, methods, integrated circuits, computer programs, or recording media.

Hereinafter, exemplary embodiments according to the present invention are described with reference to the accompanying Drawings. Each of the exemplary embodiments described below shows a specific example of the present invention. The numerical values, shapes, structural elements, the arrangement and connection of the structural elements, steps, the processing order of the steps etc. shown in the following exemplary embodiments are mere examples, and therefore do not limit the present invention. Therefore, among the structural elements in the following exemplary embodiments, structural elements not recited in any one of the independent claims are described as arbitrary structural elements.

(Embodiment 1)

Figure 2:
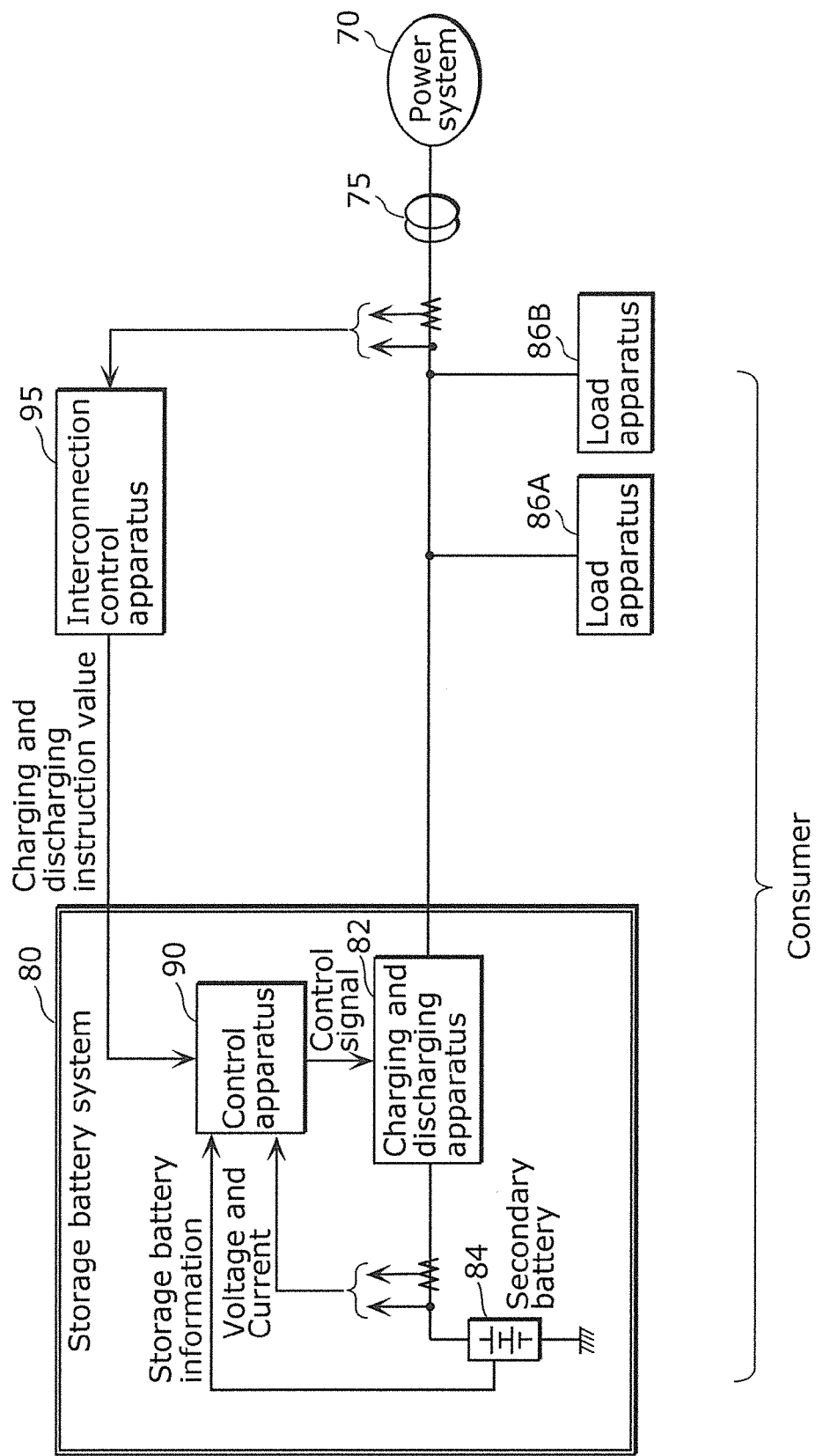
FIG. 2 is a diagram schematically showing a storage battery system according to Embodiment 1.

FIG. 2 is a diagram schematically showing a secondary battery system 80 according to Embodiment 1 of the present invention.

The secondary battery system 80 is, for example, provided at each consumer. Furthermore, the secondary battery system 80 controls charging and discharging of a secondary battery 84, based on a charging and discharging instruction value (hereinafter, may also be referred to as an "instruction value") obtained from an interconnection control apparatus 95.

As shown in FIG. 2, the secondary battery system 80 is interconnected to a power system 70 via a transformer 75. Accordingly, the secondary battery system 80 is capable of charging the secondary battery 84 with power obtained from the power system 70. Furthermore, the secondary battery system 80 is capable of supplying power to general load apparatuses 86A and 86B at the consumer by discharging the secondary battery 84.

More specifically, the secondary battery system 80 includes a charging and discharging apparatus 82, the secondary battery 84, and a charging and discharging control apparatus 90. In the following description, the charging and discharging control apparatus 90 may be referred to as the control apparatus 90 unless specifically mentioned.

The charging and discharging apparatus 82 charges or discharges (hereinafter, may also referred to as "charging and discharging") the secondary battery 84, based on a control signal obtained from the control apparatus 90. For example, the charging and discharging apparatus 82 may include at least an inverter (DC/AC convertor) or a convertor (DC/DC convertor).

The secondary battery 84 is a single secondary battery or includes a plurality of secondary batteries connected in series or in parallel. The secondary battery 84 may be any type of secondary battery, such as a lithium-ion battery, a lead storage battery, a sodium-sulfur battery, or a nickel-cadmium battery.

Information indicating voltage charged to the secondary battery 84 and information indicating voltage discharged from the secondary battery 84 are transmitted to the control apparatus 90 via a wire or wireless communication. In addition to the voltage, information indicating at least one of (i) current to be charged to the secondary battery 84 and (ii) current to be discharged from the secondary battery 84 may be transmitted to the control apparatus 90.

The control apparatus 90 generates a control signal including, for example, a value of current to be charged to or discharged from the secondary battery 84, and charging or discharging time and period, and output the control signal to the charging and discharging apparatus 82. For example, the control apparatus 90 may transmit, to the charging and discharging apparatus 82, a control signal for controlling charging and discharging of the secondary battery 84, according to a predetermined mode. More specifically, the control apparatus 90 may perform control such that power obtained from the power system 70 is charged to the secondary battery 84 during night time and the charged power is discharged from the secondary battery 84 during day time. In accordance with this, it is possible to effectively use nighttime power which has lower fees. Furthermore, when the secondary battery system 80 is further connected to a power generation facility at the consumer, the control apparatus 90 may perform control such that power generated at the power generation facility is charged to the secondary battery 84. In this case, the power charged to the secondary battery 84 is sold or discharged when the consumer consumes power. Furthermore, the control apparatus 90 may perform control such that power is discharged from the secondary battery 84 preferentially in case of power outage.

The control apparatus 90 includes a degradation state estimating apparatus that will be described referring to FIG. 3 and following drawings. The degradation state estimating apparatus included in the control apparatus 90 according to Embodiment 1 is capable of estimating SOH which indicates the degree of degradation in the secondary battery 84 in parallel with charging and discharging control performed on the secondary battery 84. The degradation state estimating apparatus included in the control apparatus 90 is capable of, for example, extending life of the secondary battery 84, by performing different controls on the secondary battery 84 according to the SOH. Detailed descriptions will be given later.

In FIG. 2, the interconnection control apparatus 95 is provided outside the secondary battery system 80. However, the secondary battery system 80 may include the interconnection control apparatus 95. It may also be that the charging and discharging control apparatus 90 includes the interconnection control apparatus 95.

Figure 3:
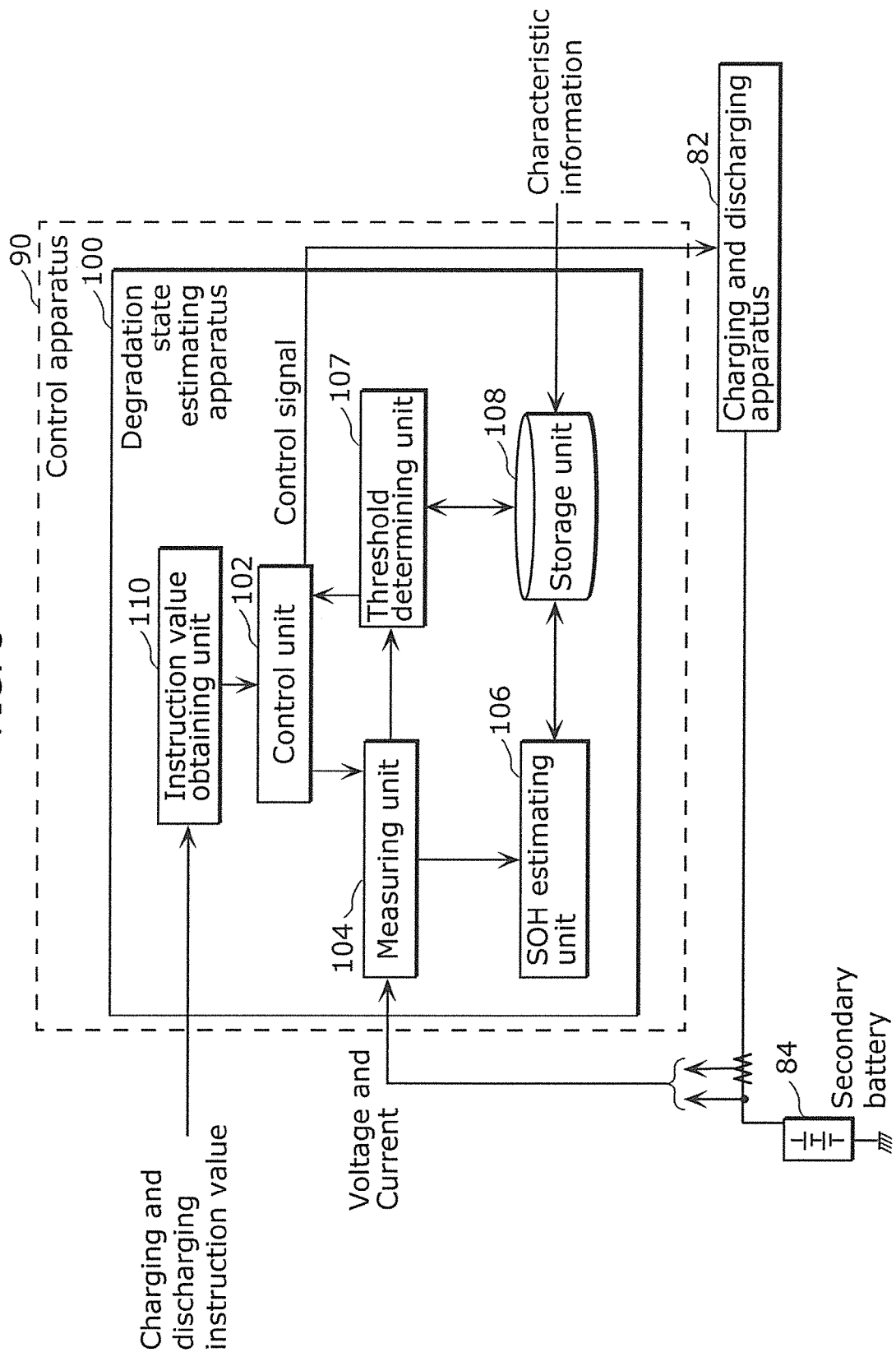
FIG. 3 is a diagram showing functional blocks of a control apparatus according to Embodiment 1.

FIG. 3 is a functional block diagram of a degradation state estimating apparatus 100 included in the control apparatus 90 according to Embodiment 1. The degradation state estimating apparatus 100 controls charging and discharging of the secondary battery, based on an instruction value. The instruction value here refers to a value which defines the value of charging and discharging current that is current required for charging and discharging of the secondary battery.

More specifically, as shown in FIG. 3, the degradation state estimating apparatus 100 includes a control unit 102, a measuring unit 104, an SOH estimating unit 106, a threshold determining unit 107, a storage unit 108, and an instruction value obtaining unit 110.

The storage unit 108 stores models used for estimating the degradation state, as predetermined characteristic information of the secondary battery. The characteristic information of the secondary battery refers to information corresponding to data obtained through experiments in advance. In other words, the characteristic information refers to information which relates the magnitude of a parameter of an equivalent circuit model of the secondary battery (to be described later) and SOH of the secondary battery. More specifically, the storage unit 108 stores, for example, the characteristic information of the secondary battery connected, functional expressions of mathematized characteristic information, or a table of discretized functional expressions of mathematized characteristic information. The storage unit 108 is implemented by a random access memory (RAM), a read only memory (ROM), a static random access memory (SRAM), or the like.

The instruction value obtaining unit 110 obtains an instruction value from, for example, the interconnection control apparatus 95.

The threshold determining unit 107 determines a threshold for a period in which duration is determined, based on time constant for voltage change in the secondary battery 84. The time constant for the voltage change in the secondary battery 84 is calculated from parameters of an equivalent circuit model of the secondary battery 84 obtained in the process of estimating the SOH of the secondary battery 84, as described later. The degradation state estimating apparatus 100 may determine a threshold from objective information, such as the number of cycles of the secondary battery 84 or the operating time period of the secondary battery 84, which is known to have a cause-and-effect relationship to the degradation of the secondary battery. Accordingly, even when the time constant is not calculated yet, such as at the time of first use of the degradation state estimating apparatus 100, a threshold can be appropriately determined. Detailed descriptions will be given later.

The control unit 102 (i) determines, based on the instruction value obtained by the instruction value obtaining unit 110, the value of charging and discharging current of the secondary battery 84 as the value of the current, and determines, based on the threshold determined by the threshold determining unit 107, a period during which the value of the charging and discharging current is maintained, as the duration, and (ii) controls charging and discharging of the secondary battery 84 at the determined current value and over the determined duration. More specifically, the control unit 102 determines the length of duration to exceed the threshold determined by the threshold determining unit 107.

For example, it is assumed that the instruction value obtaining unit 110 obtains an instruction value for each first period from the interconnection control apparatus 95. Here, when the threshold is less than the first period, the control unit 102 may determine the length of the first period as the length of duration. When the threshold is greater than or equal to the first period, the control unit 102 may determine the length of the duration to be greater than or equal to the threshold.

The measuring unit 104 obtains, as measurement information, at least voltage values of the secondary battery 84 measured during control of charging or discharging of the secondary battery 84 according to the control signal obtained from the control unit 102. For example, the measuring unit 104 may obtain the output from a voltage sensor provided between the terminals of the secondary battery 84, in wireless or wire communications. When the secondary battery 84 includes a plurality of secondary batteries, the measuring unit 104 may obtain the voltage value of each secondary battery, or the voltage value of the entire secondary battery 84. When the voltage value of each secondary battery is obtained, it is possible to estimate the SOH for each secondary battery. The measuring unit 104 may further obtain the current value of the secondary battery 84 as the measurement information.

The SOH estimating unit 106 estimates the SOH of the secondary battery 84, based on the characteristic information of the secondary battery 84 stored in the storage unit 108 and the measurement information obtained by the measuring unit 104. Details of the method of estimating the SOH will be described later.

Next, referring to FIG. 4 to FIG. 6B, descriptions will be given of relationship between current flowing through a secondary battery and voltage, before describing processing performed by the control unit 102 according to Embodiment 1.

Figure 4:
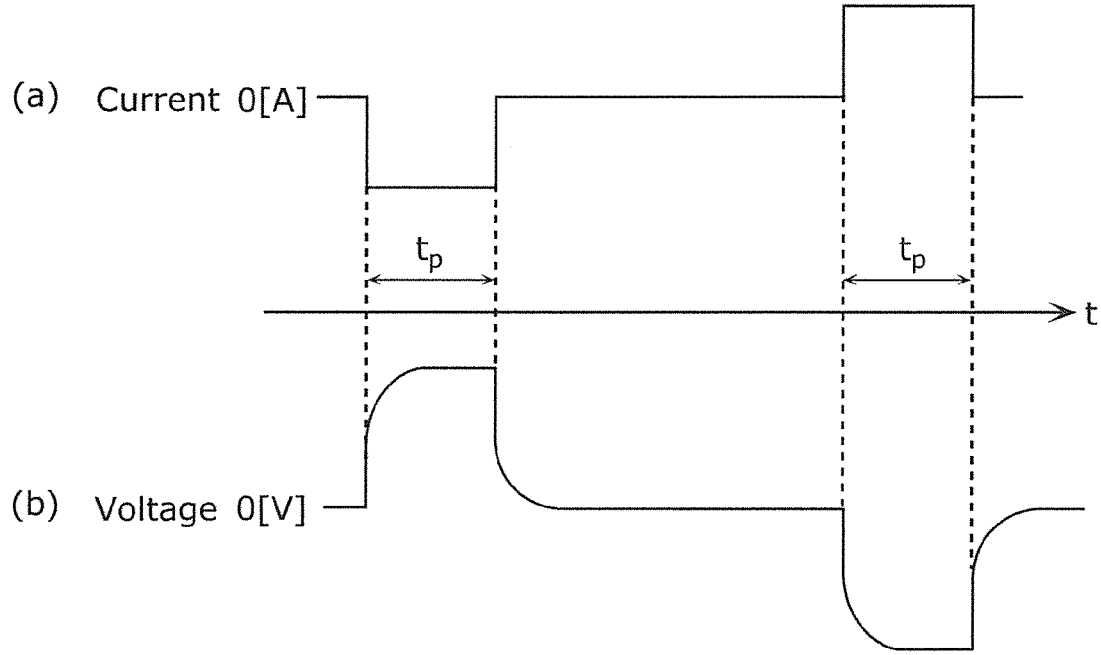
FIG. 4 is a diagram showing change in terminal voltage of a storage battery when current with positive and negative amplitudes flows through a storage battery for each time period $t_p$.

FIG. 4 shows change in terminal voltage of a secondary battery when current with positive and negative amplitudes flows through the secondary battery for each time period $t_p$. More specifically, in FIG. 4, (a) shows the amplitude of current flowing through the secondary battery. In FIG. 4, (b) shows change in voltage of the secondary battery when the current shown in (a) of FIG. 4 flows through the secondary battery.

Here, the state where current having negative amplitude flows through the secondary battery indicates that the secondary battery is being charged. Furthermore, the state where current having positive amplitude flows through the secondary battery indicates that the secondary battery is being discharged. As shown in FIG. 4, in the secondary battery, voltage rises when being charged and drops when being discharged.

FIG. 5 shows relationship between degradation states of secondary batteries and terminal voltage. More specifically, in FIG. 5, (a) shows current flowing through the secondary battery. As shown in (a) of FIG. 5, the case is assumed where pulse current having an amplitude of $-I_1$ during time period T1 and time period T2 flows through a secondary battery.

In FIG. 5, (b) shows terminal voltage of a new secondary battery when current shown in (a) of FIG. 5 flows through the secondary battery. As shown in (b) of FIG. 5, equal voltage $V_1$ is generated in both T1 and T2. Hence, it can be seen that voltage reaches the steady state in both T1 and T2.

In FIG. 5, (c) shows terminal voltage of a degraded secondary battery when the current shown in (c) of FIG. 5 flows through the secondary battery. As shown in (c) of FIG. 5, when the current flows through the secondary battery for the time period T2, voltage $V_2$ ($>V_1$) is generated. However, the voltage generated when the current flows through the secondary battery for the time period T1 is lower than voltage $V_2$. This is because the time constant for voltage change in the degraded secondary battery increases compared to the new secondary battery, which prevents voltage from reaching the steady state during current flow over the time period T1.

This shows that, in order to obtain the terminal voltage of the secondary battery accurately, current needs to flow through the secondary battery over a longer period of time as degradation of the secondary battery progresses. It is not always necessary to measure the terminal voltage in the steady state for estimating the SOH. The SOH can be estimated as long as the terminal voltage of the secondary battery has a voltage change amount necessary for estimating the SOH. However, higher level of accuracy in voltage measurement leads to estimation of the SOH with higher level of accuracy.

Figure 6A:
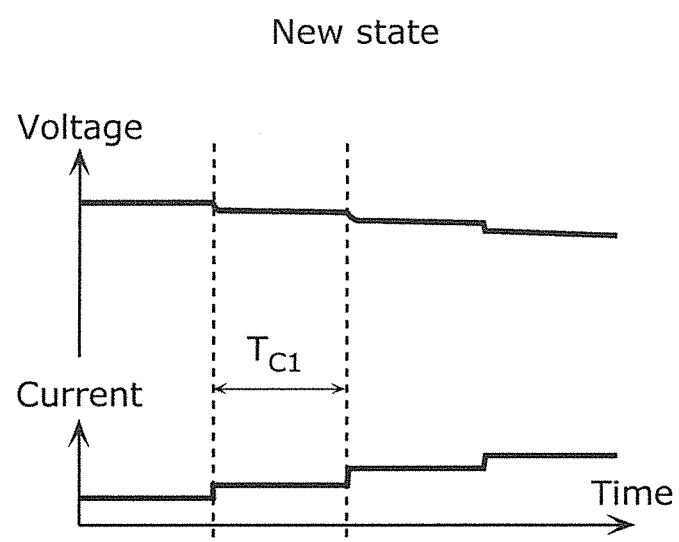
FIG. 6A is a diagram showing relationship between current and voltage when current, which increases in a staircase pattern over time, flows through a new storage battery.
Figure 6B:
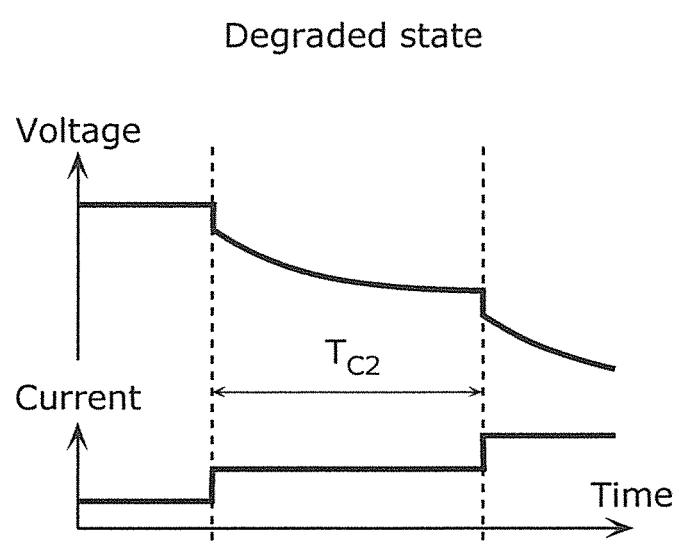
FIG. 6B is a diagram showing relationship between current and voltage when current, which increases in a staircase pattern over time, flows through a degraded storage battery.

FIG. 6A and FIG. 6B each shows an example where current is applied to the secondary battery over a longer period of time as the degradation of the secondary battery progresses. More specifically, FIG. 6A shows relationship between current and voltage when current, which increases in a stepwise manner over time, flows through a new secondary battery. FIG. 6B shows relationship between current and voltage when current, which increases in a stepwise manner over time, flows through a degraded secondary battery.

In FIG. 6A, current, having a value which changes every time period $T_{c1}$, flows through the secondary battery. On the other hand, in FIG. 6B, current, having a current value which changes every time period $T_{c2}$ ($>T_{c1}$), flows through the secondary battery. As shown in FIG. 6B, since the time constant of the secondary battery increases due to degradation, current with a constant value is applied to the secondary battery over time period $T_{c2}$ that is required for voltage to reach the steady state.

The threshold determining unit 107 determines, as a threshold, a value corresponding to the time period necessary for voltage of the secondary battery to reach the steady state. When the degradation state estimating apparatus 100 generates and outputs a control signal for each duration, the control unit 102 generates a control signal such that the duration exceeds the threshold. Accordingly, the degradation state estimating apparatus 100 is capable of accurately obtaining the voltage change in the secondary battery.

The control unit 102 may further determine a plurality of sets each including the current value of current and duration, based on the amount of change, made in a second period, of a plurality of instruction values obtained in the second period. More specifically, the control unit 102 may determine a plurality of sets such that the amount of change, made in the second period, in value of charging and discharging current determined by the instruction values obtained in the second period is equal to the amount of change, made in the second period, in values of the charging and discharging current in the sets determined according to the instruction values. Here, the term "a plurality of sets" refers to plural sets each including duration determined by the control unit 102 and the current value of current generated in each duration, and refers to the control signal generated by the control unit 102. Hereinafter, a description is given referring to FIG. 7A and FIG. 7B.

Figure 7A:
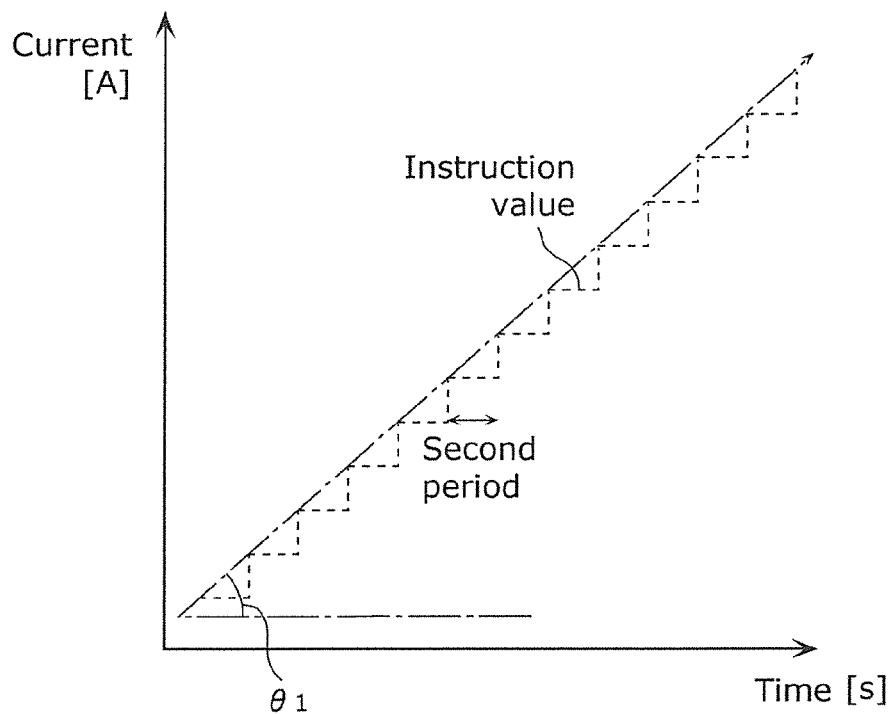
FIG. 7A is a diagram showing an instruction value for causing current having a staircase pattern waveform to flow through a storage battery.

FIG. 7A shows an instruction value (dashed line) for causing current having a stepwise waveform to flow through a secondary battery. More specifically, the horizontal axis represents time [s], and the vertical axis represents current value [A] indicated by the instruction value. Furthermore, $\theta_1$ represents the slope of the instruction value. Here, the slope of the instruction value refers to, for example, the amount of change in instruction value during time period of n steps (that is, n second periods) of the waveform of the instruction value.

Figure 7B:
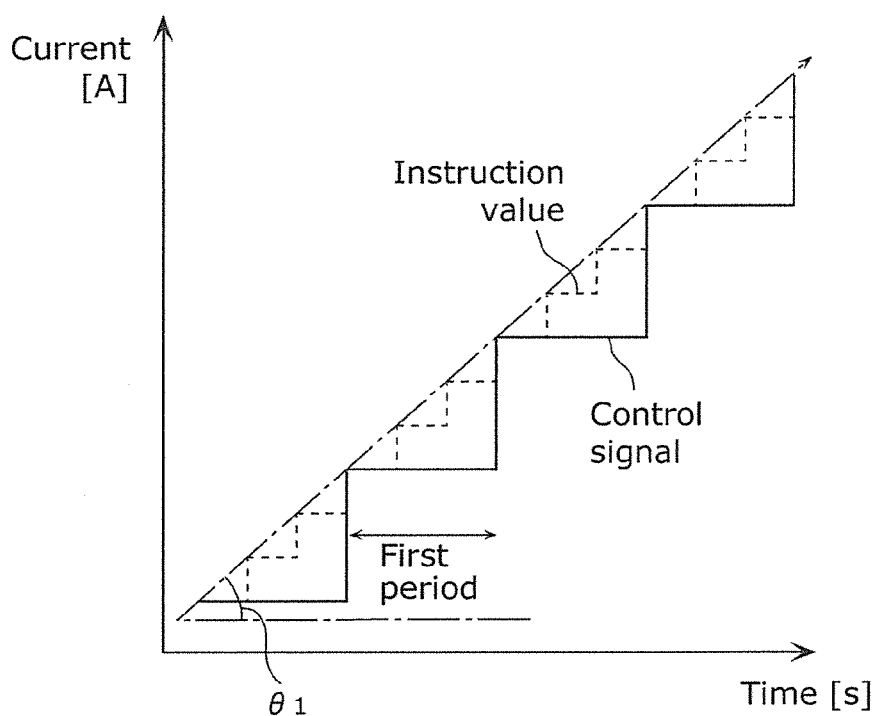
FIG. 7B is a diagram showing a control signal generated by a control unit.

FIG. 7B shows a control signal (solid line) generated by the control unit 102. The horizontal axis represents time [s], and the vertical axis represents current value [A] indicated by the control signal. The dashed line indicates the same instruction value as in FIG. 7A. Furthermore, $\theta_1$ represents the slope of the control signal. Here, the slope of the control signal refers to the amount of change in control signal during time periods of n steps (that is, n first periods) of the control signal.

For example, it is assumed that since degradation of a secondary battery has progressed, three of second periods are necessary for the voltage of the secondary battery to reach the steady state. In this case, in order to generate a control signal, the control unit 102 needs to determine (i) the length of the first period and (2) the magnitude of the control signal that is output for each first period. Here, the control unit 102 uses, as the first period, the length equals to three second periods. Furthermore, the control unit 102 uses, as the magnitude of the control signal, the magnitude of the instruction value equal to three second periods. As a result, as shown in FIG. 7B, the control unit 102 generates a control signal which is equal to the instruction value in slope and having a period corresponding to periods of three instruction values.

Figure 8:
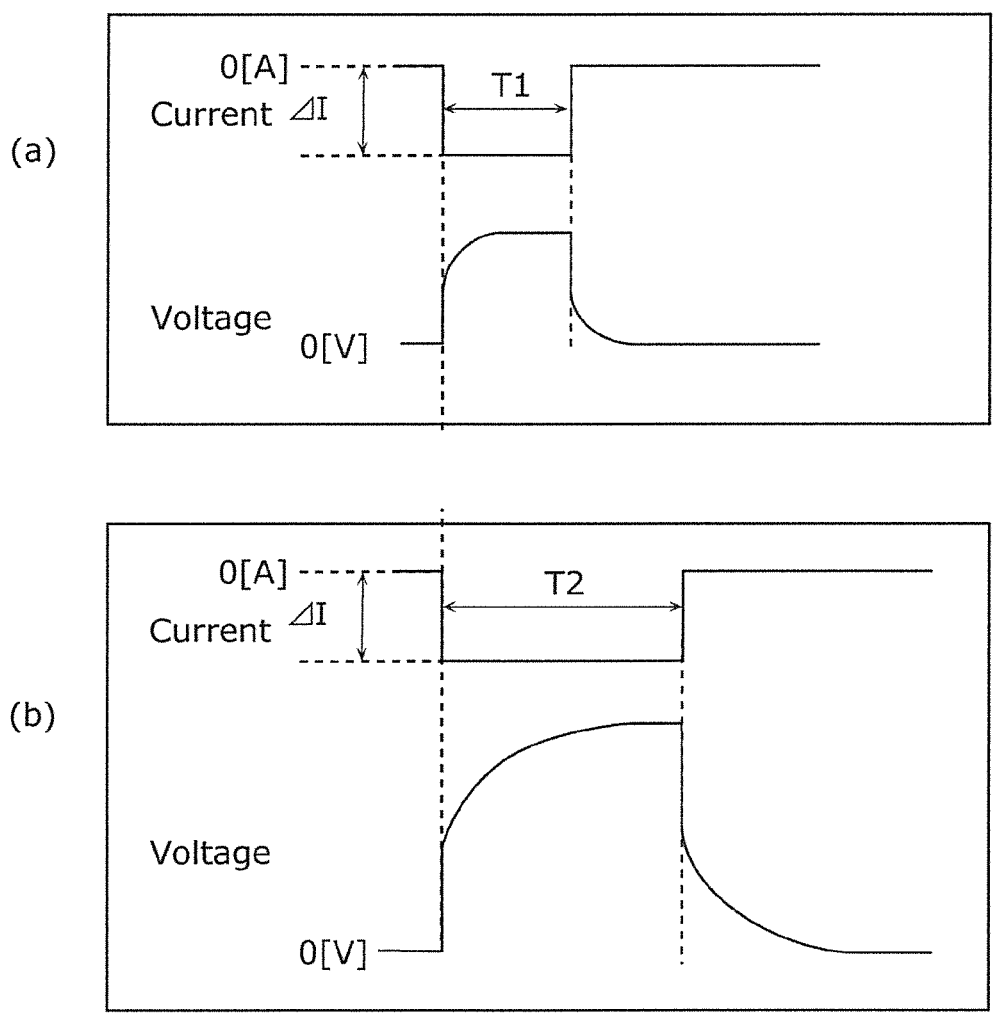
FIG. 8 shows waveforms of current flowing through a storage battery and corresponding terminal voltage.

FIG. 8 shows waveforms of secondary battery current and corresponding terminal voltage. More specifically, in FIG. 8, (a) shows changes in current value [A] and corresponding terminal voltage [V] of a new secondary battery when the secondary battery is charged with current having a magnitude of I for time period T1. Furthermore, in FIG. 8, (b) shows changes in current value [A] and corresponding terminal voltage [V] of a degraded secondary battery when the secondary battery is charged with current having a magnitude of I for time period T2. As shown in FIG. 8, since the degraded secondary battery needs to be charged over a longer period of time, the degraded secondary battery has a higher elevated level of the terminal voltage.

Figure 9:
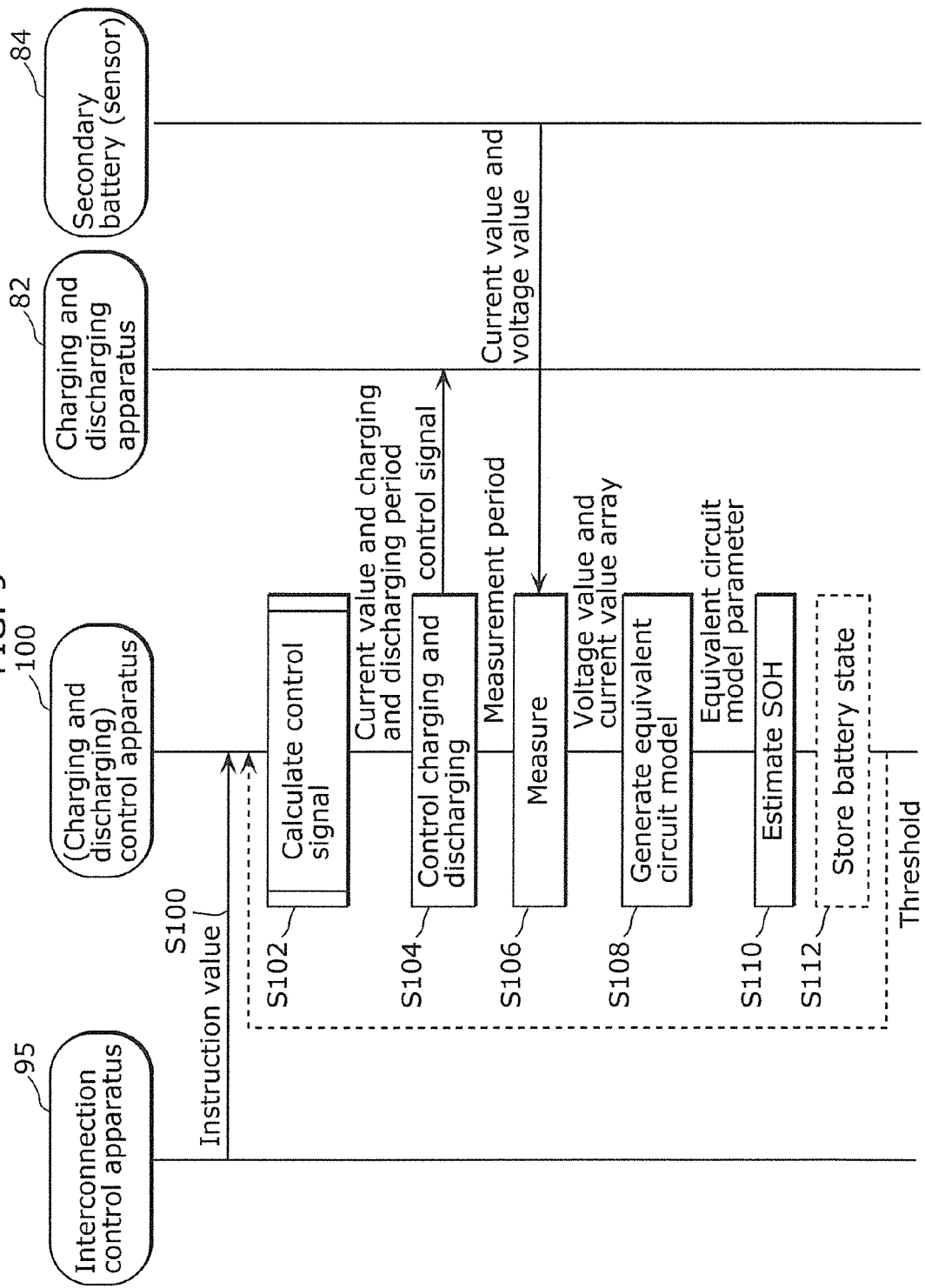
FIG. 9 is a diagram showing an operation sequence of the control apparatus according to Embodiment 1.
Figure 10:
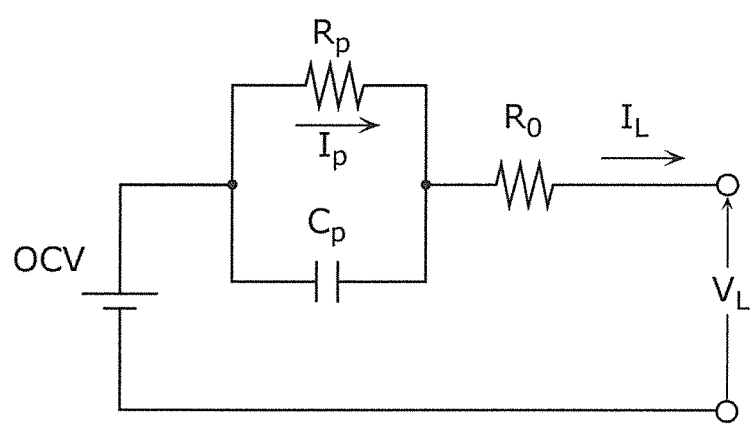
FIG. 10 is a diagram showing an example of an equivalent circuit model of a secondary battery used by an SOH estimating unit in Embodiment 1.
Figure 11:
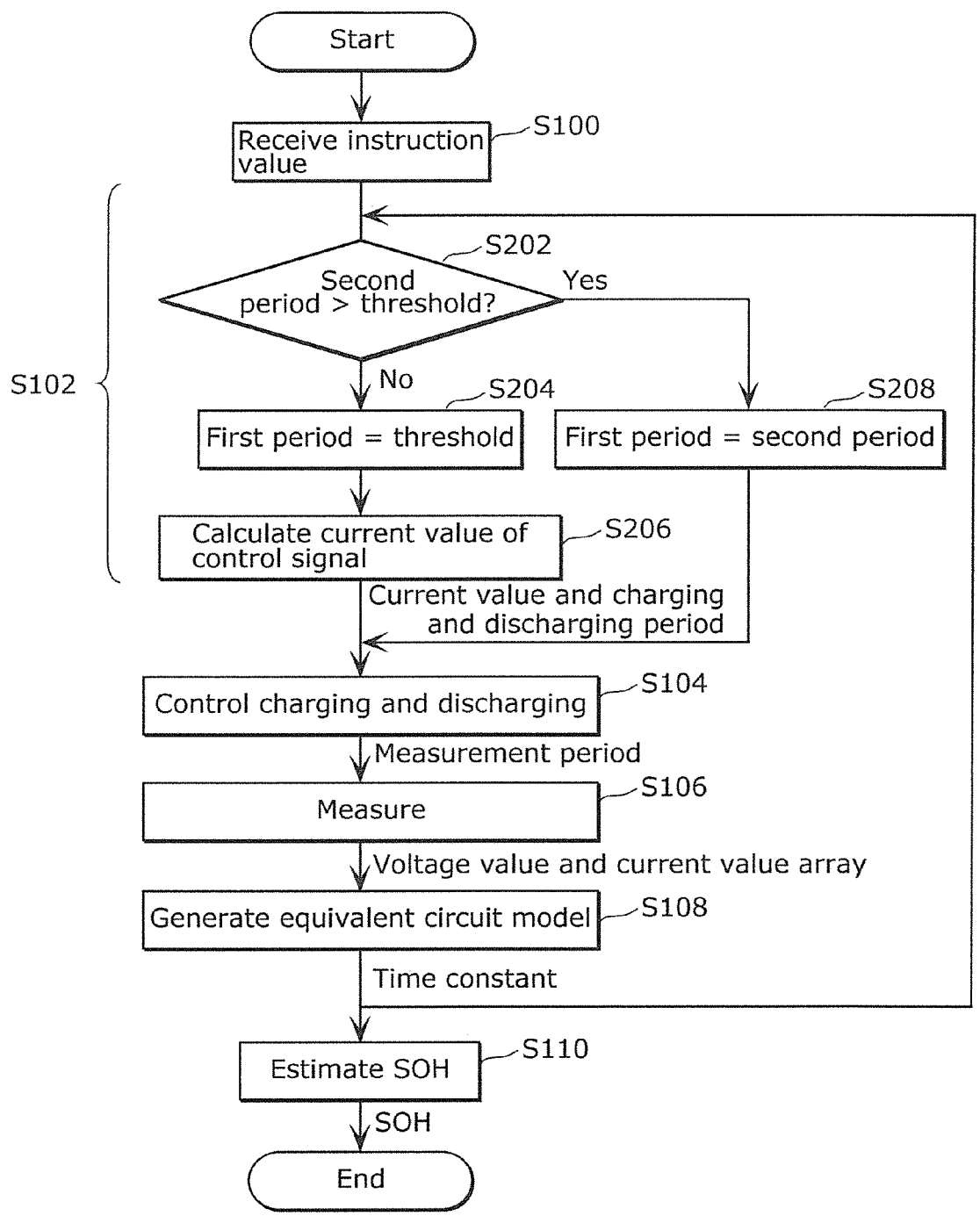
FIG. 11 is a flowchart of processing performed by the control apparatus according to Embodiment 1.

Next, referring to FIG. 9 to FIG. 11, a description is given of flow of processing performed by the degradation state estimating apparatus 100 according to Embodiment 1.

FIG. 9 shows operation sequence of the degradation state estimating apparatus 100 according to Embodiment 1.

First, the control unit 102 included in the degradation state estimating apparatus 100 obtains an instruction value from the interconnection control apparatus 95 (S100). Next, the control unit 102 calculates a control signal, based on the obtained instruction value and the threshold determined by the threshold determining unit 107 (S102). More specifically, the control signal includes information indicating the magnitude of current and time period during which the current is applied. Detailed processing will be described later.

Next, the control unit 102 transmits the control signal to the charging and discharging apparatus 82 to apply the current indicated by the control signal calculated in Step S102 to the secondary battery 84 (S104).

Next, the measuring unit 104 included in the degradation state estimating apparatus 100 obtains a current value and a voltage value from the secondary battery 84 (S106). As described above, the measuring unit 104 may obtain at least the voltage value.

Furthermore, when the measuring unit 104 does not include a voltage sensor or the like, the measuring unit 104 may obtain the current value of the current flowing through the secondary battery 84 and the voltage value across the terminals, from a voltage sensor or the like provided outside the measuring unit 104.

The measuring unit 104 obtains the current value and the voltage value multiple times, for example, every few milliseconds. The current values and the voltage values thus obtained may be stored temporarily in the storage unit 108 included in the degradation state estimating apparatus 100, for example, in a predetermined data structure such as an array or a list.

Next, the SOH estimating unit 106 included in the degradation state estimating apparatus 100 determines, from the voltage values and the current values obtained by the measuring unit 104, parameters of the equivalent circuit model of the secondary battery 84, through, for example, a non-linear regression analysis using least-square method (S108).

Subsequently, the SOH estimating unit 106 estimates the SOH from the parameter values of the equivalent circuit model determined in Step S108 (S110). For example, when it is assumed for purpose of illustration that the temperature of the secondary battery 84 is constant, the SOH of the secondary battery 84 is estimated by the non-linear regression represented by Equation 1.

$$SOH = p_0 \times R_0 + p_1 \times R_p + p_2 \times C_p + p_3 \ldots \quad \text{(Equation 1)}$$

Here, $R_0$, $R_p$, and $C_p$ are parameters of the equivalent circuit model that will be described later. Furthermore, $p_0$, $p_1$, $p_2$, and $p_3$ are regression coefficients obtained through experiments conducted in advance. In other words, the regression coefficients $p_0$, $p_1$, $p_2$, and $p_3$ are specific examples of the characteristic information stored in the storage unit 108.

The degradation state estimating apparatus 100 may store, in the storage unit 108, information indicating the state of the secondary battery, such as the parameters of the equivalent circuit model determined in Step S108 or SOH (S112). With this, the threshold determining unit 107 is capable of determining appropriate thresholds by calculating the time constant of the secondary battery, from the parameters of the equivalent circuit model previously determined by the SOH estimating unit 106.

FIG. 10 shows an example of an equivalent circuit model of the secondary battery used by the SOH estimating unit 106 in Embodiment 1.

In FIG. 10, $V_L$ and $I_L$ respectively represent the voltage value and the current value of the secondary battery. Furthermore, $R_p$, $C_p$, and $R_0$ are parameters used in the Equation 1 above. More specifically, $R_p$ represents polarization resistance component. $C_p$ represents polarization capacitance component. $R_o$ represents electrolyte resistance component. In other words, $R_p$, $C_p$, and $R_0$ correspond to the internal resistance of the secondary battery. Since $R_p$, $C_p$, and $R_0$ increases as the degradation of the secondary battery progresses, SOH can be estimated by using the Equation 1. Furthermore, the threshold determining unit 107 may calculate the time constant for voltage change in the secondary battery 84 by calculating $R_p \times C_p$, and determine to use the obtained time constant as a threshold.

More specifically, the current value of the current flowing through the secondary battery and the terminal voltage are measured at a predetermined sampling interval. The parameters $R_p$, $C_p$, and $R_0$ of the equivalent circuit model are determined such that the obtained actual measurement values of the current and voltage match the theoretical values obtained from the equivalent circuit model of the secondary battery. More specifically, for example, the method in PTL 2 which discloses a related technology may be used.

In FIG. 10, a three-order model with three parameters is used as an equivalent circuit model of the secondary battery. However, for example, other models may be used, such as a fifth-order model with five parameters.

Figure 12:
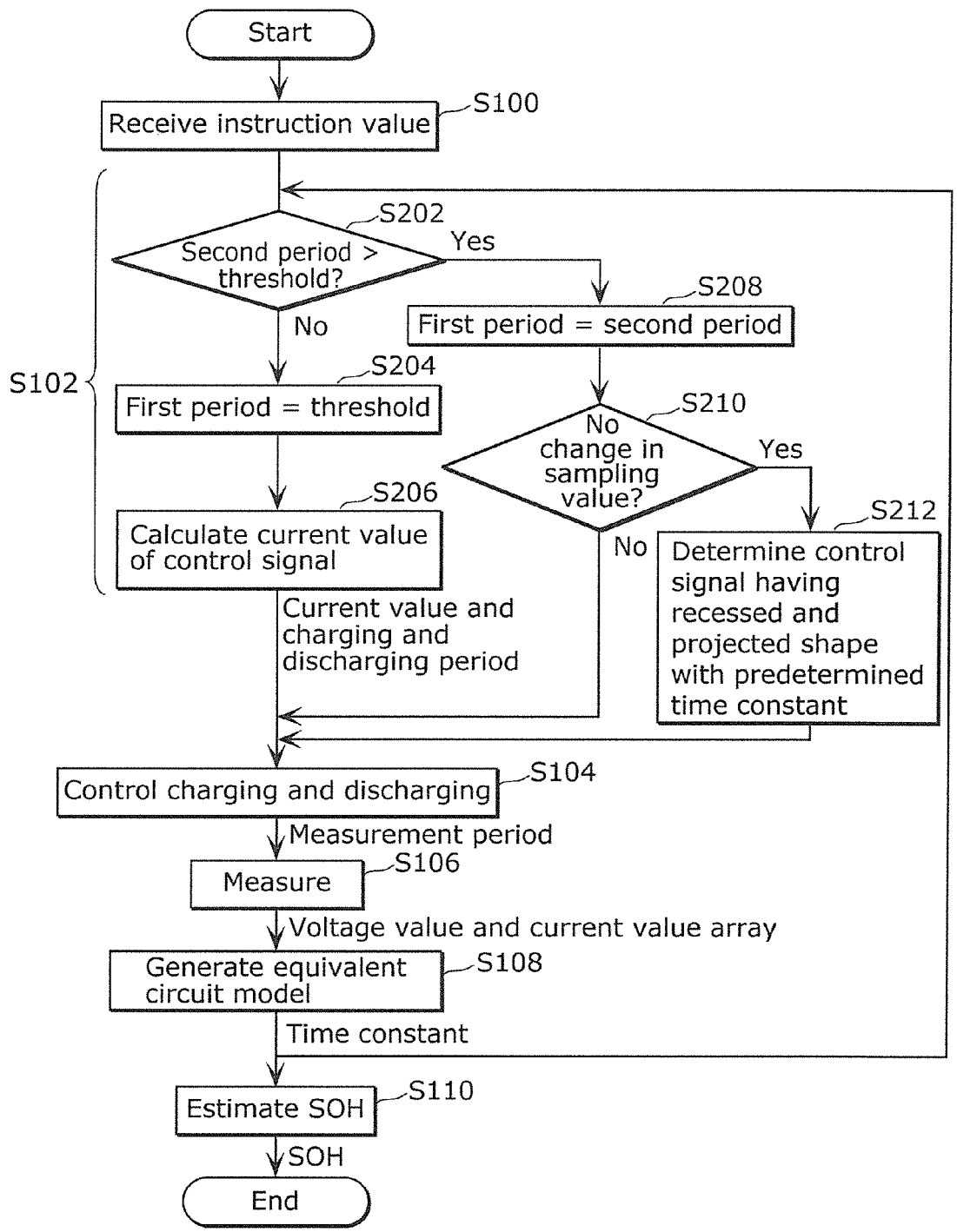
FIG. 12 is a flowchart of processing performed by a control apparatus according to Variation of Embodiment 1.

Next, referring to FIG. 11 and FIG. 12, a more detailed description is given of the operation sequence of the degradation state estimating apparatus 100 according to Embodiment 1 shown in FIG. 9.

FIG. 11 is a flowchart of processing performed by the degradation state estimating apparatus 100 according to Embodiment 1. The same steps as those in FIG. 9 are assigned with the same reference numerals, and the detailed descriptions thereof are omitted.

First, the instruction value obtaining unit 110 obtains an instruction value from the interconnection control apparatus 95 (S100).

Next, the control unit 102 compares a first period with the threshold determined by the threshold determining unit 107 (S202). The first period is an interval of obtainment of an instruction value (that is, a period of control by the interconnection control apparatus 95 relative to the degradation state estimating apparatus 100). When the comparison result shows that the first period is greater than the threshold (Yes in S202), the control unit 102 sets the length of duration to be equal to the length of the first period (S208). The duration is an interval of output of a control signal (that is, the period of control by the degradation state estimating apparatus 100 relative to the charging and discharging apparatus 82). Furthermore, the control unit 102 performs charging and discharging control in Step S104, by using the instruction value at this time as the magnitude of the control signal. In other words, when the first period is greater than the threshold, the control unit 102 outputs the obtained instruction value as a control signal for a load apparatus.

On the other hand, when the first period is less than or equal to the threshold (No in S202), the control unit 102 sets the length of duration to be greater than or equal to the threshold (for example, sets the length of duration to be equal to the threshold) (S204). Next, the control unit 102 determines the current value of the control signal to have a slop matching the slope of the instruction value obtained in Step S100, as described referring to FIG. 7B (S206).

Steps S202, S204, S206, and S208 described above are the flow of detailed processing performed in calculation of control signal (S102) shown in FIG. 9.

The threshold determining unit 107 may determine the threshold before Step 202, for example, by the following method.

In the case where Step S108 has been performed and $R_p$ and $C_p$ which are parameters of the equivalent circuit model of the secondary battery 84 are known, the threshold determining unit 107 is capable of calculating the time constant of the secondary battery 84 by calculating $R_p \times C_p$. In this case, the threshold determining unit 107 is capable of determining, as a threshold, a value greater than or equal to the calculated time constant of the secondary battery 84.

On the other hand, in the case where $R_p$ and $C_p$ which are parameters of the equivalent circuit model of the secondary battery 84 are not known, the threshold determining unit 107 may determine a threshold to increase as the degradation of the secondary battery progresses. For example, it may be that the threshold determining unit 107 obtains cycle information which indicates the number of times the secondary battery 84 is charged or discharged, and determines a threshold to increase as the number of times the secondary battery 84 is charged or discharged increases. More specifically, as the number of times the secondary battery is charged or discharged increases, control may be performed to increase the length of duration (hereinafter, may also be referred to as a second control). Furthermore, it may be that the threshold determining unit 107 obtains the operating time period of the secondary battery, and determine a threshold to increase as the operating time period increases. More specifically, as the operating time period of the secondary battery increases, the second control may be performed. The threshold determining unit 107 may determine a threshold by using, not only the cycle information and the operating time period, but also other information which has a cause-and-effect relationship to the degradation of the secondary battery. Furthermore, the threshold determining unit 107 may determine a threshold by using the SOH estimated last time or SOHs previously estimated by the SOH estimating unit 106.

Subsequently, processing, from Step S104 where charging and discharging control is performed by a control signal transmitted to the charging and discharging apparatus 82 to Step S110 where the SOH of the secondary battery 84 is estimated, is similar to those in FIG. 9.

The degradation state estimating apparatus 100 above is capable of generating, from an instruction value, a control signal having a transmission interval and a value which allow charging and discharging control of the secondary battery 84, while maintaining accuracy in estimation of the SOH, and outputting the control signal to the secondary battery 84. As a result, it is possible to provide a control apparatus which is capable of estimating the degradation state of the secondary battery while continuously controlling charging and discharging of the secondary battery.

(Variation)

The degradation state estimating apparatus 100 according to Embodiment 1 sets parameters of the equivalent circuit model such that the measurement values of the current and voltage match the theoretical values, when estimating the parameters of the equivalent circuit model in Step S108. Accordingly, it is desirable that the current values and the voltage values moderately vary within a predetermined range. However, in Step S100, a constant current value might be continuously obtained as instruction values over a long period of time. FIG. 12 is a flowchart of processing performed by the control apparatus which is capable of estimating the SOH appropriately even when a constant instruction value is continuously obtained as described above. FIG. 12 is different from FIG. 11 in that Steps S208, S210, and S212 are added. Hence, these steps are mainly described.

When the control unit 102 determines that the second period is greater than the threshold (Yes in S202), the control unit 102 sets the length of the first period to be the length of the second period (S208).

Next, the control unit 102 checks if a control signal to be generated (that is, a sampling value of the instruction value) vary over time (S210). More specifically, the control unit 102 determines whether or not the difference between a first current value and a second current value is less than a predetermined reference value. The first current value and the second current value are current values to be determined consecutively. Subsequently, when the difference between the first current value and the second current value is less than the predetermined reference value (Yes in S210), the control unit 102 determines the first current value and the second current value such that (i) the difference between the first current value and the second current value is greater than or equal to the predetermined reference value and (ii) a sum of the first current value and the second current value is less than the predetermined reference value. As a result, the control signal generated typically has a waveform in recessed and projected shape as shown in FIG. 13B that will be described later. Subsequently, the control unit 102 outputs the control signal in Step S104.

Furthermore, when the difference between the first current value and the second current value is greater than or equal to the predetermined reference value (No in S210), the control unit 102 outputs the obtained instruction value as a control signal in Step S104

On the other hand, when the control unit 102 determines that the first period is less than or equal to the threshold (No in S202), the control unit 102 generates a control signal in Step S204 and Step S206.

As described above, the degradation state estimating apparatus 100 according to Variation of Embodiment 1 is capable of estimating the SOH with higher accuracy even when the amount of change in current value included in the instruction value is less than the amount of change necessary for estimating the SOH. In such a case, for example, the storage unit 108 may store a set of characteristic information for each representative temperature range.

In Step S206 in FIG. 11 and FIG. 12, when the control unit 102 calculates the current value of the control signal, it is preferable that the control unit 102 calculates the control signal such that the quantization error generated by making the instruction values to one control signal is minimum. A detailed description is given referring to FIG. 13A and FIG. 13B. For purpose of illustration, FIG. 13A and FIG. 13B indicate instruction values in straight lines.

Figure 13A:
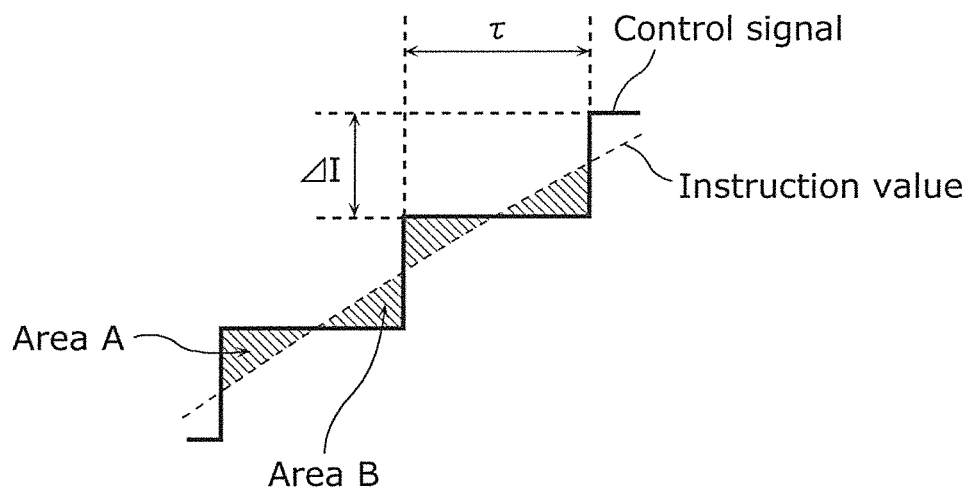
FIG. 13A is a first diagram showing a control signal determined by a control unit relative to an instruction value which monotonically increases.
Figure 13B:
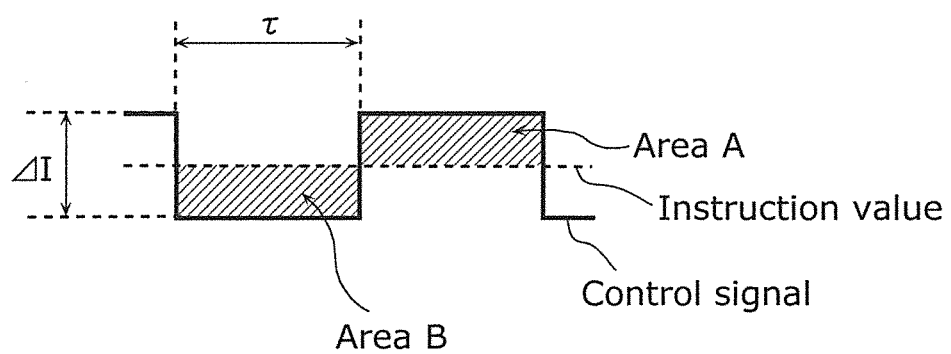
FIG. 13B is a first diagram showing a control signal determined by the control unit relative to a constant instruction value.

FIG. 13A shows the control signal determined by the control unit 102 relative to an instruction value which monotonically increases. As described above, the value of the control signal is determined such that the slope of the control signal matches the slope of the instruction value. Furthermore, in FIG. 13A, the value of the control signal is determined such that, among the regions surrounded by the waveform of the control signal and the waveform of the instruction value, the region above the instruction value and the region below the instruction value are equal in area. More specifically, an area A is equal to an area B. With this, it is possible to minimize the error in control generated when the instruction values are made to a control signal having a larger period.

FIG. 13B shows the control signal determined by the control unit 102 relative to a constant instruction value. As described above, the control signal has a recessed and projected waveform to allow accurate estimation of SOH. Furthermore, in FIG. 13B, the value of the control signal is determined such that, among the regions surrounded by the waveform of the control signal and the waveform of the instruction value, the region above the instruction value and the region below the instruction value are equal in area. More specifically, an are A is equal to an area B. With this, it is possible to minimize the error in control generated when a control signal having a recessed and projected waveform is generated.

More specifically, the control unit 102 may determine the current value such that the area obtained by integrating a differential waveform in a second period approaches zero. The differential waveform is a difference between the waveform indicating the instruction values consecutively obtained in a predetermined period and the waveform which indicates current values to be determined according to the instruction values.

Figure 14A:
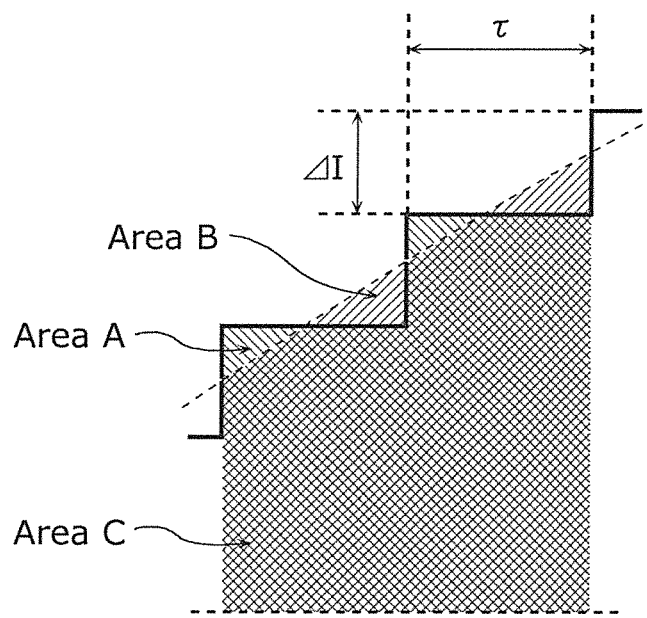
FIG. 14A is a second diagram showing a control signal determined by the control unit relative to an instruction value which monotonically increases.
Figure 14B:
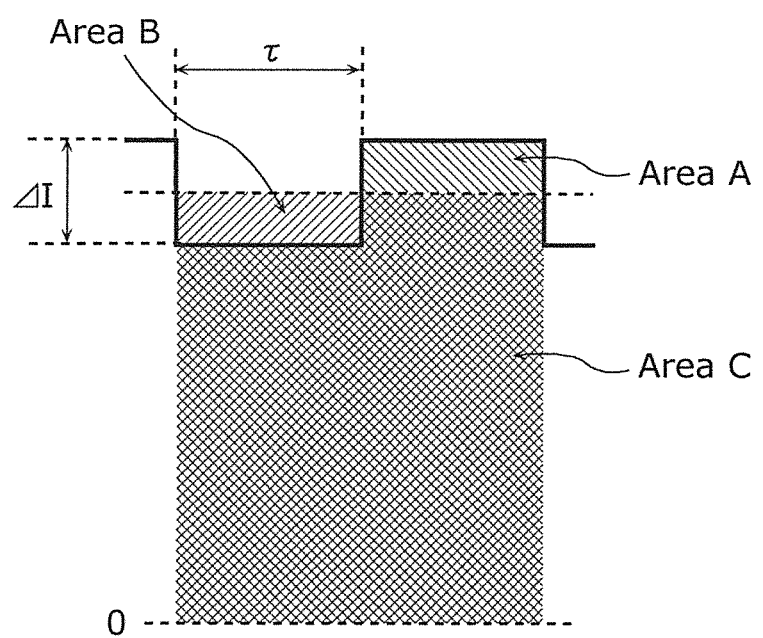
FIG. 14B is a second diagram showing a control signal determined by the control unit relative to a constant instruction value.

The control unit 102 may generate a control signal such that, as shown in FIG. 14A and FIG. 14B, the area surrounded by the control signal and x-axis (that is, the axis where current=0 [A]) is equal to the area surrounded by the instruction value and x-axis. In this case, area A+area C is equal to area B+area C.

The measuring unit 104 described in Embodiment 1 and Variation thereof may further obtain the temperature of the secondary battery. The SOH also depends on the temperature of the secondary battery in addition to the voltage of the secondary battery; and thus, the degradation state estimating apparatus 100 is capable of estimating the SOH more accurately by using the temperature of the secondary battery.

(Embodiment 2)

In the secondary battery system 80 according to Embodiment 1, the degradation state estimating apparatus 100 estimates the SOH of the secondary battery 84 while controlling charging and discharging according to an instruction value, but may also estimate the SOH by applying measuring current as current to the secondary battery 84.

Figure 15:
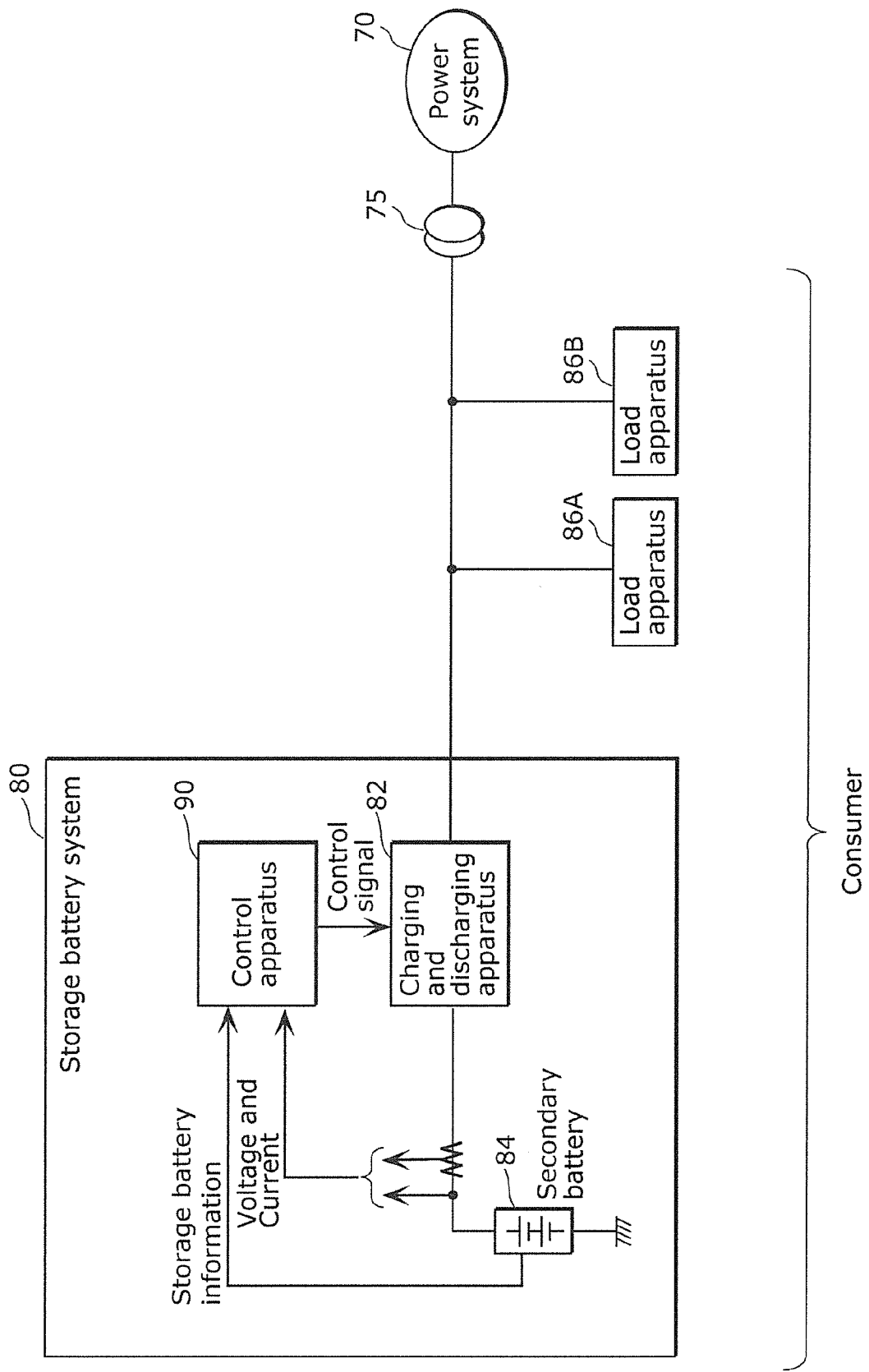
FIG. 15 is a diagram schematically showing a storage battery system according to Embodiment 2 of the present invention.

FIG. 15 schematically shows a secondary battery system 180 according to Embodiment 2 of the present invention.

The secondary battery system 180 includes a charging and discharging apparatus 82, a secondary battery 84, and a control apparatus 190.

The secondary battery system 180 is different from the secondary battery system 80 according to Embodiment 1 shown in FIG. 2 in configuration of the control apparatus 190 and in that a charging and discharging instruction value is not obtained from the interconnection control apparatus 95. Hence, a description is given of the control apparatus 190. Of the structural elements of the secondary battery system 180, the elements similar to those in the secondary battery system 180 according to Embodiment 1 are assigned with the same reference numerals, and their descriptions are omitted.

More specifically, the control apparatus 190 includes a degradation state estimating apparatus that will be described referring to FIG. 16 and following drawings. The degradation state estimating apparatus included in the control apparatus 190 according to Embodiment 2 obtains secondary battery information indicating the state of the secondary battery 84 and terminal voltage and current of the secondary battery 84, to estimate the SOH of the secondary battery 84. Examples of the secondary battery information include temperature, the number of cycles which indicates the number of times of full-charge, and operating time period of the secondary battery 84. The information above is an example of information to be obtained by the control apparatus 190 from the secondary battery 84. As described later, the control apparatus 190 is capable of estimating the SOH of the secondary battery 84 by obtaining at least the terminal voltage of the secondary battery 84.

Figure 16:
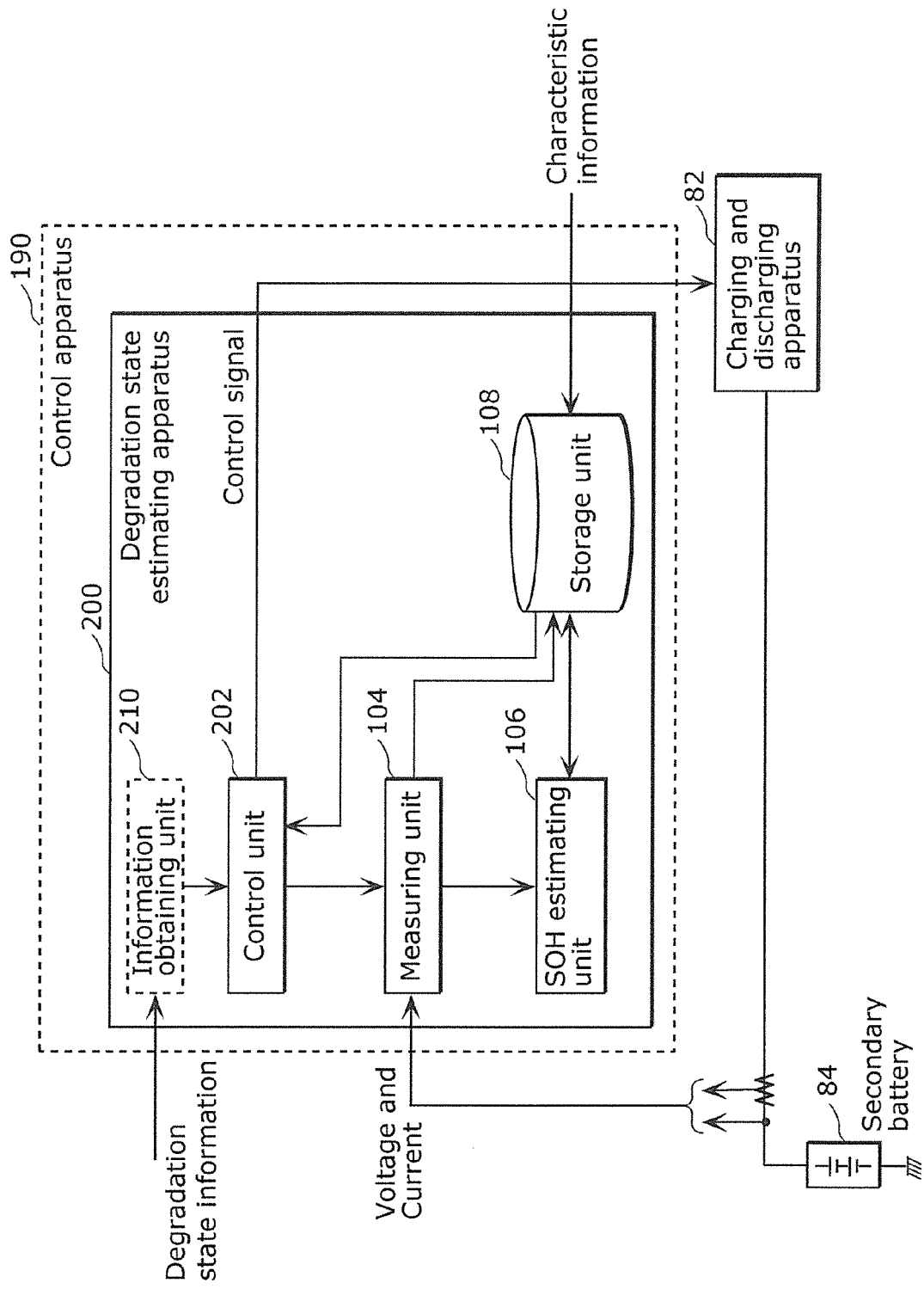
FIG. 16 is a diagram showing functional blocks of a degradation state estimating apparatus included in a control apparatus according to Embodiment 2 of the present invention.

FIG. 16 is a functional block diagram of a degradation state estimating apparatus 200 included in the control apparatus 190 according to Embodiment 2. The degradation state estimating apparatus 200 estimates the SOH.

More specifically, as shown in FIG. 3, the degradation state estimating apparatus 200 includes a control unit 202, a measuring unit 104, an SOH estimating unit 106, a storage unit 108, and an information obtaining unit 210. The degradation state estimating apparatus 200 is different from the degradation state estimating apparatus 100 according to Embodiment 1 in that the control unit 202 and the information obtaining unit 210; and thus, descriptions will be given mainly on the control unit 202 and the information obtaining unit 210.

The control unit 202 performs control for applying measuring current (current) to a secondary battery to estimate the SOH of the secondary battery. More specifically, the control unit 202 transmits a control signal to the charging and discharging apparatus 82 to apply measuring current to the secondary battery 84. Here, the control unit 202 determines, according to a provisional degradation state of the secondary battery, at least one of (i) the value of current to be applied to the secondary battery through the current control and (ii) duration during which the current is maintained at a predetermined current value. As described below, the provisional degradation state of the secondary battery, which is referred to by the control unit 202 for determining the value of the measuring current, refers to (i) objective information, such as the number of cycles of the secondary battery or the operating time period of the secondary battery, which is known to have a cause-and-effect relationship to the degradation of the secondary battery and (ii) information usable for estimating the SOH. As the provisional degradation state, the previously calculated SOH values may be used.

The measuring unit 104 obtains, as measurement information, at least the voltage value of the secondary battery measured while measuring current is flowing through the secondary battery.

The SOH estimating unit 106 estimates the SOH of the secondary battery 84, based on characteristic information stored in the storage unit 108 and the measurement information obtained by the measuring unit 104. Details of the method of estimating the SOH will be described later.

The information obtaining unit 210 obtains degradation information which is information indicating the provisional degradation state of the secondary battery. As the degradation information, for example, at least one of the followings may be used: cycle information which indicates the number of times the secondary battery is charged or discharged and the operating time period of the secondary battery. As the number of times the secondary battery is charged or discharged increases, or as the length of the operating time period increases, it is considered that degradation of the secondary battery has further progressed.

As the cycle information, for example, the number of cycles may be used which is the number of times the secondary battery is fully charged. However, the number of times of charging other than full charge or the number of times of discharging may be used as the cycle information. The cycle information and the operating time period of the secondary battery may be obtained, for example, by the information obtaining unit 210 from a management memory included in the secondary battery 84; however, it may be done in a different manner. For example, the degradation information may be managed by the storage unit 108 storing the cycle information and the operating time period of the connected secondary battery. In this case, the degradation state estimating apparatus 200 produces similar effects even without the information obtaining unit 210. Furthermore, an apparatus for managing degradation information may be provided outside the control apparatus 190.

Next, referring to FIG. 4, FIG. 17, and FIG. 18, descriptions will be given of relationship between current flowing through a secondary battery and voltage, before describing processing performed by the control unit 202 according to Embodiment 2.

It may be understood that FIG. 4 shows change in terminal voltage of a secondary battery when measuring pulse current having positive and negative amplitudes is applied for each time $t_p$. More specifically, it may be understood that (a) in FIG. 4 shows the amplitude of the measuring current applied to the secondary battery. Furthermore, it may be understood that (b) in FIG. 4 shows change in voltage of the secondary battery when the measuring current shown in (a) in FIG. 4 is applied. As shown in FIG. 4, in the secondary battery, voltage rises when being charged and drops when being discharged.

Figure 17:
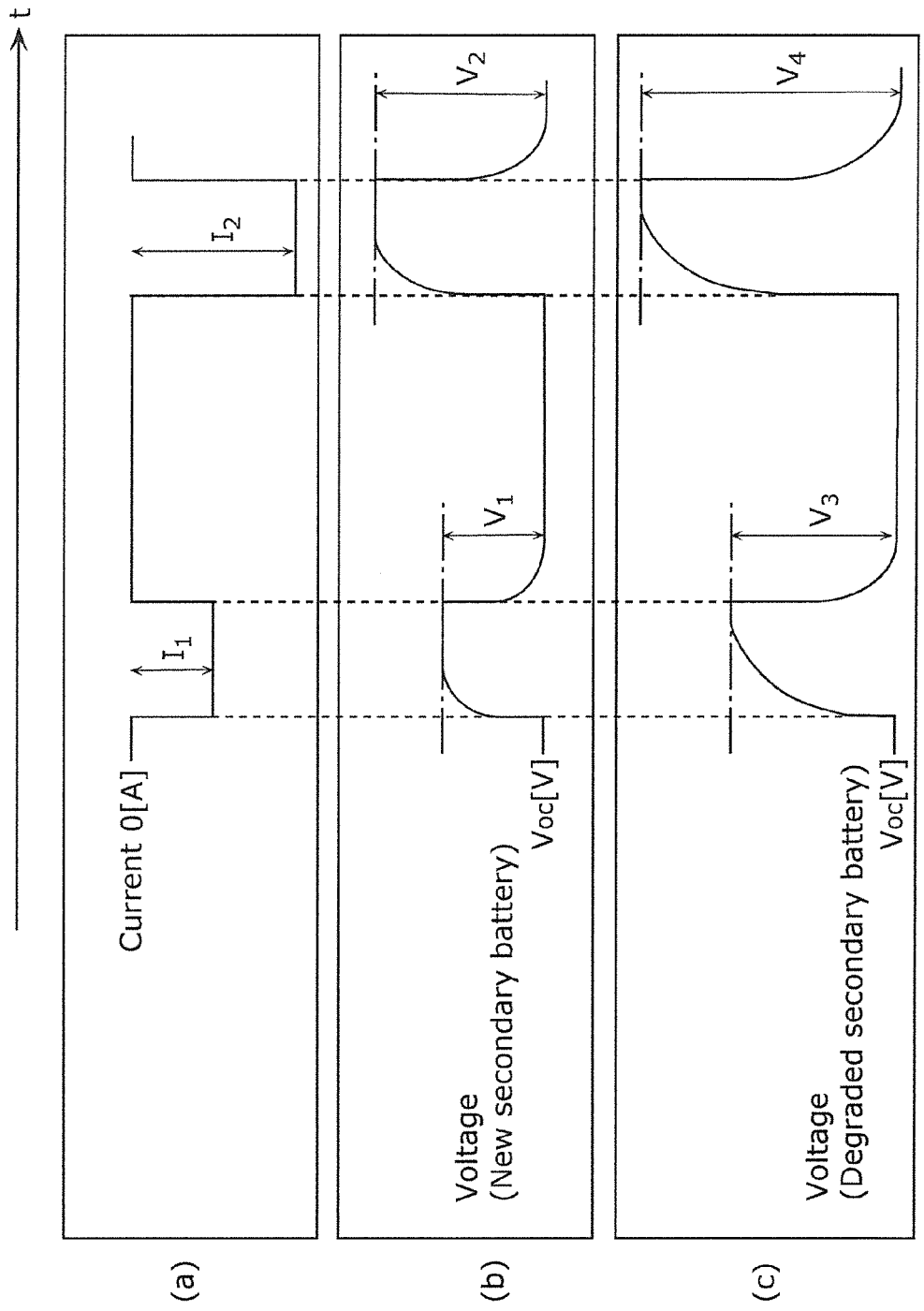
FIG. 17 shows relationship between the magnitude of measuring current which flows through a secondary battery and the amount of change in terminal amount.

FIG. 17 shows relationship between the magnitude of measuring current applied to a secondary battery and the amount of change in terminal voltage. More specifically, (a) in FIG. 17 shows an example of measuring current applied to the secondary battery.

In FIG. 17, (b) shows change in terminal voltage of a new secondary battery when the measuring current shown in (a) of FIG. 17 is applied to the secondary battery. As shown in (b) of FIG. 17, voltage changes $V_1$ and $V_2$ at maximum are generated respectively relative to current with $I_1$ and $I_2$.

In FIG. 17, (c) shows change in terminal voltage of a degraded secondary battery when the measuring current shown in (a) of FIG. 17 is applied to the secondary battery. As shown in (c) of FIG. 17, voltage changes $V_3$ and $V_4$ at maximum are generated respectively relative to current with $I_1$ and $I_2$.

Here, $V_2$ and $V_4$ are greater than $V_1$ and $V_3$, respectively. Hence, it is understood that as the current applied to the secondary battery increases, the amount of change in voltage increases. Furthermore, $V_3$ and $V_4$ are greater than $V_1$ and $V_2$, respectively. Hence, when the current value is constant, it is understood that the amount of change in voltage increases as the degradation of the secondary battery progresses.

Figure 18:
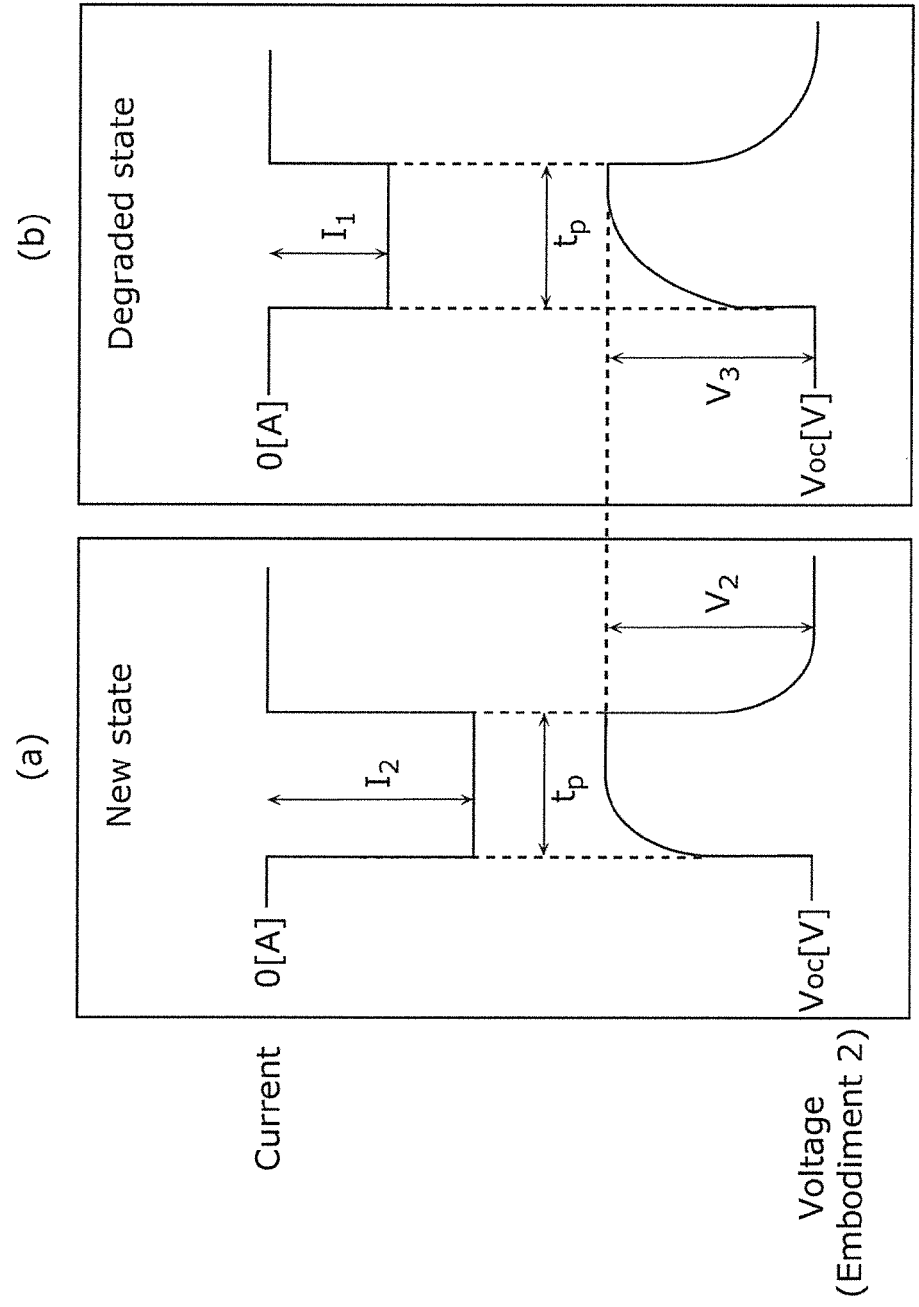
FIG. 18 schematically illustrates a method of controlling measuring current performed by a control unit according to Embodiment 2 of the present invention.

FIG. 18 schematically illustrates a method of controlling measuring current performed by the control unit 202 according to Embodiment 2. More specifically, (a) in FIG. 18 shows measuring current applied by the control unit 202 to a new secondary battery and voltage change generated. In FIG. 18, (b) shows measuring current applied by the control unit 202 to a degraded secondary battery and voltage change generated.

As shown in FIG. 18, the control unit 202 controls measuring current such that the magnitude $I_2$ of current applied to the new secondary battery is smaller than $I_1$ of current applied to the degraded secondary battery. Here, as shown in FIG. 17, the degraded secondary battery has a greater amount of voltage change relative to the measuring current. Accordingly, for example, the magnitude $I_1$ of current where $I_2 > I_1$ may be determined such that the amount of voltage change $V_2$ in the new secondary battery is equal to the amount of voltage change $V_3$ in the degraded secondary battery.

Figure 19:
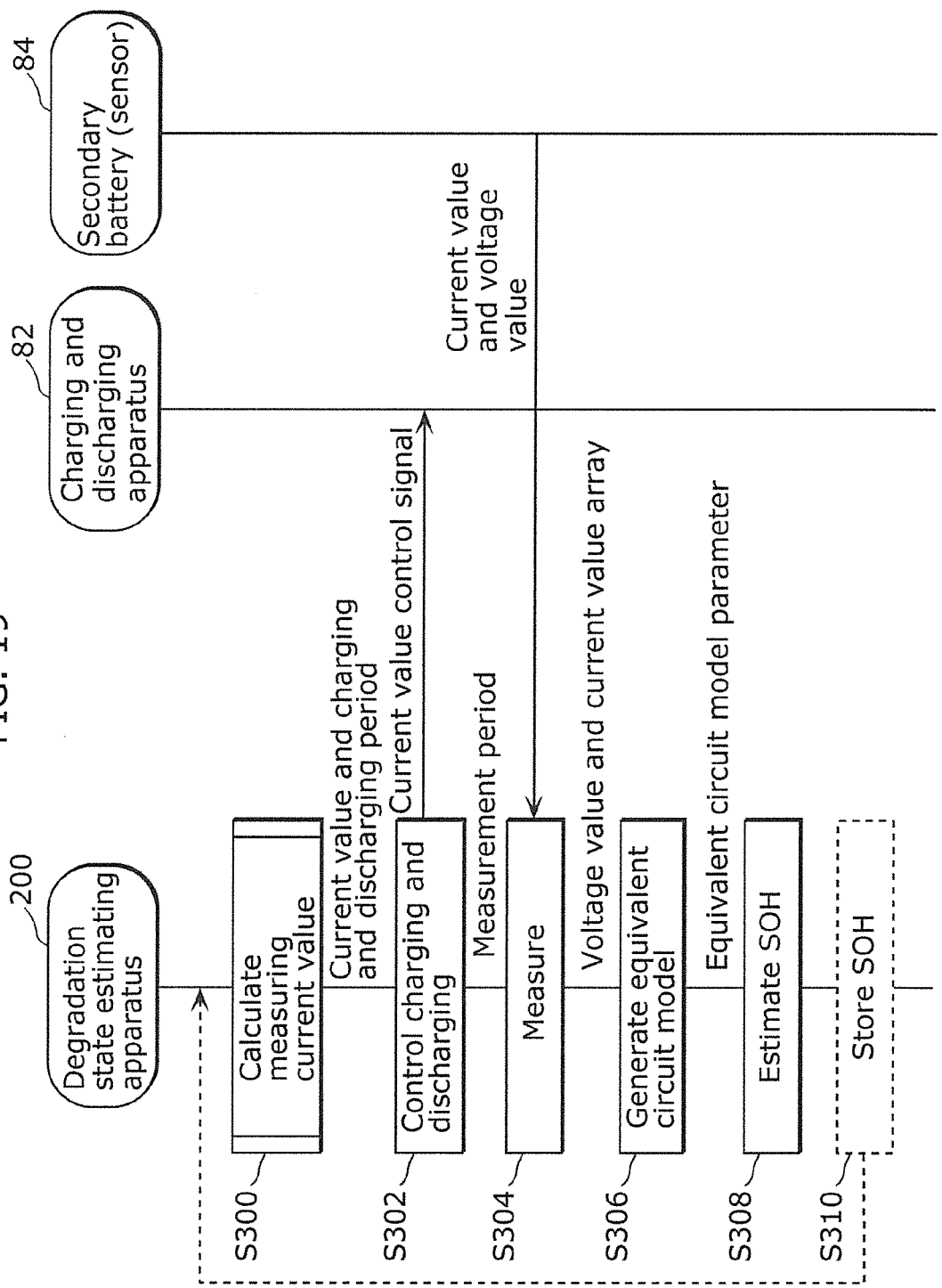
FIG. 19 is a sequence diagram showing an operation sequence of the degradation state estimating apparatus according to Embodiment 2 of the present invention.
Figure 20:
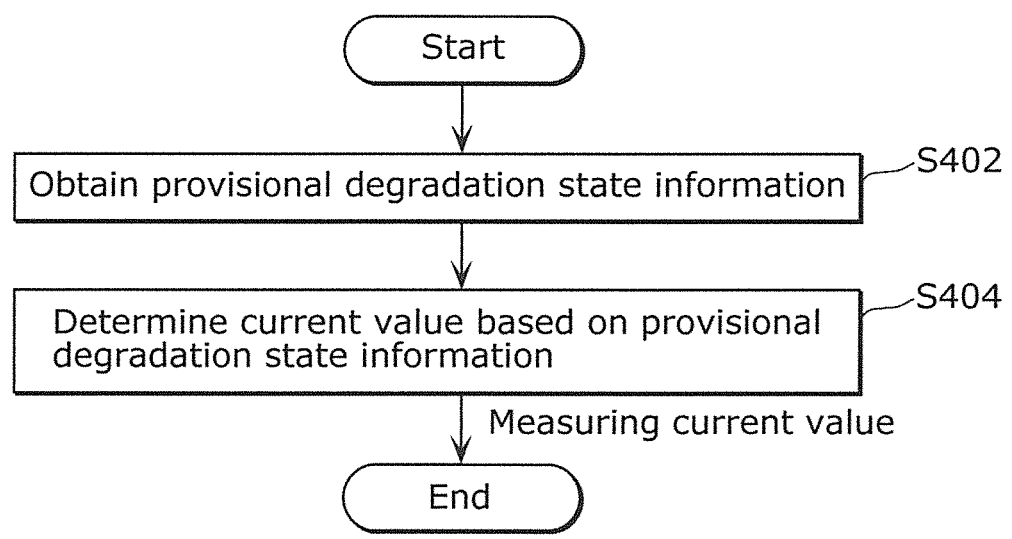
FIG. 20 is a flowchart of detailed processing of calculating measuring current value in FIG. 19, according to Embodiment 2 of the present invention.

Next, referring to FIG. 19 and FIG. 20, a description is given of detailed operations of the degradation state estimating apparatus 200 according to Embodiment 2.

FIG. 19 shows operation sequence of the degradation state estimating apparatus 200 according to Embodiment 2.

First, the control unit 202 included in the degradation state estimating apparatus 200 calculates the value of measuring current to be applied to a secondary battery to calculate the SOH of the secondary battery (S300). More specifically, the control unit 202 determines the value of the measuring current and length for which the current is applied. Detailed processing will be described later.

Next, the control unit 202 transmits a control signal for a current value to the charging and discharging apparatus 82 to apply the measuring current determined in Step S300 to the secondary battery 84 that is a measurement target (S302).

Next, the measuring unit 104 included in the degradation state estimating apparatus 200 obtains a current value and a voltage value from the secondary battery 84 (S304).

Next, the SOH estimating unit 106 included in the degradation state estimating apparatus 200 determines, from the voltage values and the current values obtained by the measuring unit 104, parameters of the equivalent circuit model of the secondary battery 84 through, for example, a non-linear regression analysis using least-square method (S306).

Subsequently, the SOH estimating unit 106 estimates the SOH from the parameter values of the equivalent circuit model determined in Step S206 (S208).

Processing from Steps 304 to 308 are respectively the same as processing from Steps 106 to 110 described referring to FIG. 9 according to Embodiment 1.

As described later, the degradation state estimating apparatus 200 may store, for example, in the storage unit 108, the SOH estimated in Step S308 (S310). Accordingly, the SOH estimating unit 106 is capable of determining the magnitude of the measuring current in Step S300, by using the previously estimated SOHs.

FIG. 20 is a flowchart of detailed processing in Step S300 in FIG. 19.

First, the information obtaining unit 210 obtains degradation information indicating the degradation state of the secondary battery (S402). As described above, for example, at least one of the number of cycles of the secondary battery, the operating time period of the secondary battery, and others, may be used as the degradation information. Furthermore, the previously calculated SOHs may be used as the degradation information.

Next, the control unit 102 determines the value of measuring current, based on the degradation state of the secondary battery (S404). More specifically, as degradation of the secondary battery indicated by the degradation information progresses, the control unit 202 performs first control for decreasing the value of the measuring current. For example, when the cycle information of the secondary battery is used as degradation information, the control unit 202 decreases the value of the measuring current as the number of times the secondary battery is charged or discharged increases. Furthermore, when the operating time period of the secondary battery is used as the degradation information, the control unit 202 decreases the value of the measuring current as the length of the operating time period of the secondary battery increases.

Accordingly, the degradation state estimating apparatus 200 according to Embodiment 2 is capable of controlling the magnitude of the measuring voltage, based on the degradation state of the secondary battery, such that the measuring voltage has at least a minimum magnitude necessary for the estimation of the SOH. As a result, it is possible to accurately estimate the SOH and to decrease degradation in the secondary battery.

(Variation 1)

In the degradation state estimating apparatus 200 according to Embodiment 2, degradation of the secondary battery is decreased by controlling the magnitude of the measuring current. Other than this, the degradation state estimating apparatus 200 is capable of increasing accuracy in estimation of the SOH, by controlling the length of period during which the measuring current is applied to the secondary battery. More specifically, the control unit 202 according to Embodiment 2 may perform a second control for increasing the length of duration during which the measuring current is maintained at a predetermined current value, as degradation of the secondary battery indicated by the degradation information progresses. In other words, the control unit 202 is capable of increasing accuracy in estimation of the SOH, by controlling at least one of the first control and the second control as the degradation of the secondary battery progresses. More specifically, the control unit 202 may perform as least the first control or the second control as the number of times the secondary battery is charged or discharged increases or the length of the operating time period of the secondary battery increases.

For example, referring back to FIG. 18 again, in (a) of FIG. 18, the waveform of voltage reaches a balanced state during time $t_p$. On the other hand, in (b) of FIG. 18, the waveform of voltage is in the transient state also during time period $t_p$. Accordingly, the true value of the voltage of the secondary battery has a possibility of being higher than voltage $V_3$. Hence, as shown in (b) of FIG. 18, when measuring current is applied to a degraded secondary battery, it is understood that more accurate voltage value can be obtained by applying the current over a longer period of time.

Furthermore, it may be that when a current value is controlled by a control signal having a recessed and projected waveform as shown in FIG. 13B in the degradation state estimating apparatus 100 according to Embodiment 1, control may be performed not only for increasing the length of duration but also for decreasing the value of the current applied to the secondary battery, as degradation of the secondary battery progresses.

(Variation 2)

Next, a description is given of Variation 2 of the degradation state estimating apparatus 200 according to Embodiment 2. In Variation 2, the control unit 202 uses, as the degradation information indicating the degradation state of the secondary battery, the SOHs previously estimated by the SOH estimating unit 106.

Figure 21:
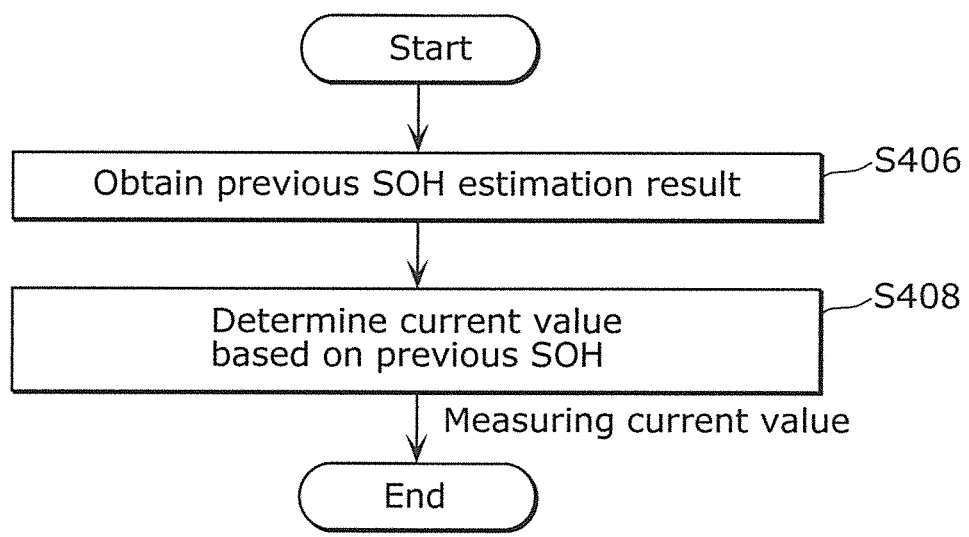
FIG. 21 is a flowchart of detailed processing of calculating measuring current value in FIG. 19, according to Variation 2 of Embodiment 2 of the present invention.

FIG. 21 is a flowchart of detailed processing performed by the control unit 202 included in the degradation state estimating apparatus 200 according to Variation 2 for determining the magnitude of the measuring current.

First, the control unit 202 obtains the SOHs previously estimated by the SOH estimating unit 106 (S406). For example, referring back to FIG. 19 again, in Step S310, the storage unit 108 stores the SOHs estimated by the SOH estimating unit 106. Accordingly, the control unit 202 obtains, from the storage unit 108, the last SOH and the second past SOH. In the followings, for purpose of illustration, the second past SOH is referred to as a first SOH, and the last SOH is referred to as a first SOH. More specifically, the second SOH is the SOH estimated by the SOH estimating unit 106 subsequent to the first SOH. When the storage unit 108 does not store two or more SOHs such as at the time of first use of the degradation state estimating apparatus 200, it may be that, for example, a predetermined value that is stored in advance is used as the SOH.

Next, the control unit 202 determines the magnitude of the measuring current, based on the SOHs obtained in Step S406 (S408). For example, when the control unit 202 compares the first SOH with the second SOH and determines that the second SOH is greater than the first SOH, the control unit 202 performs at least one of (i) control for increasing the value of the measuring current and (ii) control for decreasing the length of the duration. When the second SOH is less than the first SOH, the control unit 202 performs at least one of (i) control for decreasing the value of the measuring current and (ii) control for increasing the length of the duration.

The state where the second SOH is less than the first SOH refers to the state where degradation of the secondary battery has further progressed. Accordingly, by performing at least one of (i) control for decreasing the measuring current and (ii) control for increasing the length of the duration, the progress of the degradation of the secondary battery can be reduced. On the other hand, the state where the first SOH is less than the second SOH may be the case where an error is included in the estimation of the SOH due to an error in measurement by the measuring unit 104 or a modeling error, for example. In this case, accuracy in estimation of the SOH can be increased by performing at least one of (i) control for increasing the measuring current and (ii) control for decreasing the length of the duration.

In the above description, the control unit 102 obtains the last SOH and the second past SOH. However, the control unit 102 may obtain other SOHs. For example, the control unit 102 may obtain, as the first SOH, the j-th past SOH, and obtain, as the second SOH, the i-th past SOH. Here, i and j are natural numbers where i<j. Furthermore, the control unit 102 may obtain, as the first SOH, an average value of the m-th to n-th past SOHs, and obtain, as the second SOH, an average value of the k-th to l-th past SOHs. Here, k, l, m, and n are, for example, natural numbers where k<l<m<n.

Furthermore, in the similar manner, the degradation state estimating apparatus 100 according to Embodiment 1 may use, as the degradation information, the SHOs previously estimated.

(Variation 3)

Next, a description is given of the control unit 202 according to Variation 3 in the processing for determining the magnitude of the measuring current.

The control unit 202 according to Variation 3 of Embodiment 2 determines the value of the measuring current such that the amount of change in voltage of the secondary battery approaches a predetermined reference value. In other words, the control unit 202 performs a feedback control such that the measuring current applied to the secondary battery is equal to a predetermined magnitude.

Figure 22:
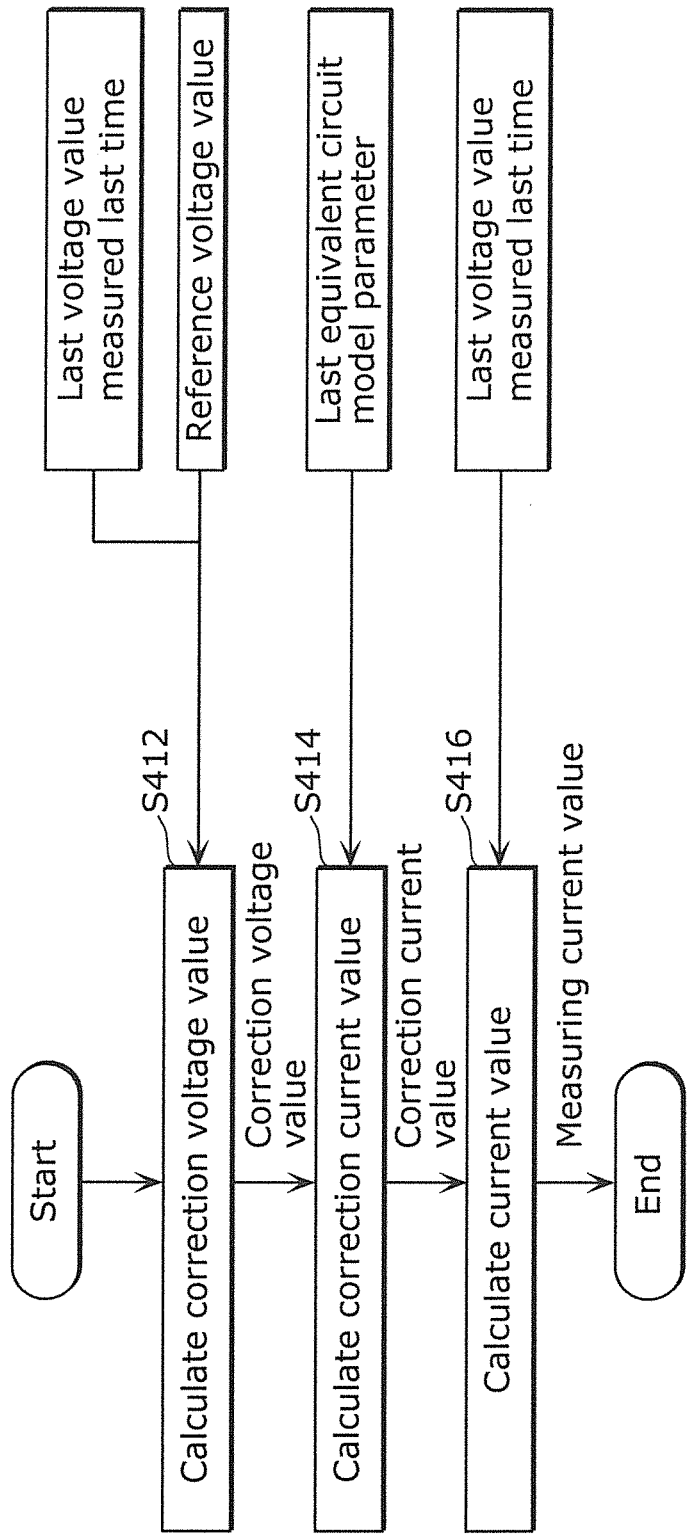
FIG. 22 is a flowchart of detailed processing of calculating measuring current value in FIG. 19, according to Variation 3 of Embodiment 2 of the present invention.

FIG. 22 is a flowchart of detailed processing performed by the control unit 202 included in the degradation state estimating apparatus 200 according to Variation 3 for determining the magnitude of the measuring current.

First, the control unit 202 calculates a correction voltage value (S412). The correction voltage value is obtained by subtracting the voltage value of the secondary battery measured last time from a predetermined reference voltage value. For example, by causing the storage unit 108 and others to store the voltage value of the secondary battery each time the measuring unit 104 obtains the voltage value, the control unit 202 is capable of obtaining the voltage value measured last time.

Next, the control unit 202 calculates a correction current value (S414). The correction current value is obtained by the following Equation 2.

Correction current value=correction voltage value/$(R_p+R_o)$  (Equation 2)

Here, $R_p$ and $R_o$ are parameters of the equivalent circuit model of the secondary battery determined by the SOH estimating unit 106.

Lastly, the control unit 202 calculates the value of the measuring current (S416). The measuring current value is obtained by adding the correction current value obtained in Step S414 and the last measuring current. For example, by causing the storage unit 108 and others to store the value of the measuring current each time the control unit 202 determines the measuring current value, the control unit 202 is capable of obtaining the last measuring current value.

The reference voltage value can be determined, for example, as follows. The value of voltage change in the secondary battery obtained by the measuring unit 104 may include an error caused by the resolution of the voltage sensor. The error causes serious influence, especially at a small amount of change in voltage. Accordingly, it may be that for each voltage sensor, the amount of change in voltage that is required in accurate estimation of the equivalent circuit model is experimentally obtained, and the obtained value is used as a reference voltage value.

With the degradation state estimating apparatus 200 according to Variation 3 described above, it is possible to apply, to a secondary battery, measuring voltage minimum necessary, according to the resolution of a sensor for measuring the voltage of the secondary battery. Accordingly, it is possible to further decrease degradation of the secondary battery without decreasing accuracy in estimation of the SOH.

The measuring unit 104 according to the above embodiments and variations thereof may measure a current value in addition to the voltage value of the secondary battery. The control apparatus 190 controls the secondary battery by transmitting a current instruction value for an output of a predetermined current value. However, an error may be generated between the current value actually outputted from the secondary battery and the current instruction value. Hence, it is possible to more accurately estimate the degradation state of the secondary battery by the measuring unit 104 measuring the voltage value and the current value of the secondary battery. Furthermore, the SOH is determined depending on the temperature of the secondary battery, in addition to the voltage value. In the above description, the temperature of the secondary battery is constant; however, the measuring unit 104 may further measure the temperature of the secondary battery. In this case, the degradation state estimating apparatus 200 is capable of more accurately estimating the SOH by storing, in the storage unit 108, characteristic information for each of some temperature ranges, for example.

Furthermore, the degradation state estimating apparatus 100 according to Embodiment 1 may determine the value of the current applied to the secondary battery such that the amount of voltage change in the secondary battery approaches a predetermined reference value.

(Other Embodiments)

The control apparatus in the storage battery system described in Embodiment 1, Variation of Embodiment 1, Embodiment 2, Variation 1 of Embodiment 2, and Variation 2 of Embodiment 2 may be implemented as an external server provided apart from the charging and discharging apparatus 82 and the secondary battery 84. More specifically, for example, as a management server for collectively managing the charging and discharging apparatuses 82 and the secondary batteries 84, the control apparatus may control the charging and discharging apparatuses 84 and the secondary batteries 84 over the network. In short, the control apparatus may be implemented on the cloud.

Furthermore, the control apparatus in the storage battery system described in Embodiment 1, Variation of Embodiment 1, Embodiment 2, Variation 1 of Embodiment 2, and Variation 2 of Embodiment 2 may be implemented as an apparatus for estimating the SOH of a secondary battery used in an electric vehicle.

Each of the structural elements in each of the above-described embodiments may be configured in the form of an exclusive hardware product, or may be realized by executing a software program suitable for the structural element. Each of the structural elements may be realized by means of a program executing unit, such as a CPU or a processor, reading and executing the software program recorded on a recording medium such as a hard disk or a semiconductor memory. Here, the software program for realizing the image decoding apparatus according to each of the embodiments is a program described below.

More specifically, the program causes a computer to execute a degradation state estimating method of estimating a state of health (SOH) which is a value indicating the degradation state of a secondary battery. The degradation state estimating method includes: controlling application of a current to the secondary battery; obtaining, as measurement information, at least a voltage value of the secondary battery measured while the current is flowing through the secondary battery; and estimating the SOH of the secondary battery, based on characteristic information of the secondary battery and the measurement information obtained in the obtaining. In the controlling, at least one of a current value of the current to be applied to the secondary battery and duration during which the current is maintained at a predetermined current value is determined according to a provisional degradation state of the secondary battery.

Furthermore, the control apparatus in the storage battery system described in Embodiment 1, Variation of Embodiment 1, Embodiment 2, Variation 1 of Embodiment 2, and Variation 2 of Embodiment 2 may be implemented by a computer.

Furthermore, part or all of the structural elements in each apparatus above may be configured from a single system large scale integrated (LSI) circuit. The system LSI is a super-multi-function LSI manufactured by integrating structural elements on one chip, and is specifically a computer system configured by including a microprocessor, a read only memory (ROM), a random access memory (RAM), and so on. The RAM stores a computer program. The system LSI achieves the functions through the microprocessor's operation according to the computer program.

A part or all of the structural elements included in each apparatus above may be configured as an IC card removable from each apparatus or as a stand-alone module. The IC card or the module is a computer system configured from a microprocessor, a ROM, a RAM, and so on. The IC card or the module may include the super-multi-function LSI. The IC card or the module achieves its function through the microprocessor's operation according to the computer program. The IC card or the module may also be implemented to be tamper-resistant.

Furthermore, the present invention may be implemented as a method described above. The method may be implemented as a computer program causing a computer to execute the method. Furthermore, the present invention may be implemented as a digital signal including the computer program.

Furthermore, the present invention may also be implemented by a computer-readable recording medium storing the computer program or the digital signal, such as flexible disc, a hard disk, a CD-ROM, an MO, a DVD, a DVD-ROM, a DVD-RAM, a BD (Blu-ray Disc (registered trademark)), a USB memory, a memory card such as a SD card, and a semiconductor memory. Furthermore, the present invention may also be implemented by the digital signal stored in the recording medium.

Furthermore, the present invention may transmit the computer program or the digital signal via a telecommunication line, a wireless or wired communication line, a network represented by the Internet, a data broadcast and so on.

Furthermore, the present invention may be implemented by a computer system including a microprocessor and a memory. It may be that the memory stores the computer program and the microprocessor operates according to the computer program.

Furthermore, by transferring the computer program or the digital signal after recording onto the aforementioned recording media, or by transferring the computer program or digital signal via the aforementioned network and the like, the present invention may be implemented using another independent computer system.

Furthermore, the above embodiments and variations may be combined.

The embodiments disclosed above are exemplary in all respects, and thus are not intended to limit the present invention. The scope of the present invention is defined by the Claims not by the Description, and all possible modifications having equivalents to those in the Claims and within the scope of the Claims are intended to be included in the present invention.

Although the degradation state estimating method and the degradation state estimating apparatus according one or more aspects of the present invention have been described based on embodiments above, the present invention is not limited to the embodiments. Those skilled in the art will readily appreciate that various modifications may be made in these exemplary embodiments without materially departing from the principles and spirit of the inventive concept, the scope of which is defined in the appended Claims and their equivalents.

INDUSTRIAL APPLICABILITY

The present invention can be applied to a control apparatus. In particular, the present invention can be applied to a control apparatus which controls charging and discharging of a secondary battery based on an instruction value.

REFERENCE SIGNS LIST

70 Power system
75 Transformer
80, 180 Secondary battery system
82 Charging and discharging apparatus
84 Secondary battery
86A, 86B Load apparatus
90, 190 Control apparatus (Charging and discharging control apparatus)
95 Interconnection control apparatus
100, 200 Degradation state estimating apparatus
102, 202 Control unit
104 Measuring unit
106 SOH estimating unit
107 Threshold determining unit
108 Storage unit
110 Instruction value obtaining unit
210 Information obtaining unit

The invention claimed is:

1. A degradation state estimating method of estimating a degradation state of a secondary battery, the degradation state estimating method comprising:
controlling application of a current to the secondary battery;
obtaining, as measurement information, at least a voltage value of the secondary battery measured while the current is flowing through the secondary battery;
estimating the degradation state of the secondary battery, based on a model for estimating the degradation state of the secondary battery and the measurement information obtained in the obtaining, and
obtaining degradation information which is information indicating a provisional degradation state of the secondary battery,
wherein, in the controlling, as degradation of the secondary battery indicated by the degradation information progresses, a second control for increasing a length of duration during which the current to be applied to the secondary battery is maintained at a predetermined current value is performed.

2. The degradation state estimating method according to claim 1,
wherein, in the obtaining of degradation information, cycle information indicating a total number of times the secondary battery is charged or discharged is obtained as the degradation information, and
in the controlling, the second control is performed as the total number of times the secondary battery is charged or discharged increases.

3. The degradation state estimating method according to claim 1,
wherein, in the obtaining of degradation information, an operating time period of the secondary battery is obtained as the degradation information, and in the controlling, the second control is performed as a length of the operating time period of the secondary battery increases.

4. The degradation state estimating method according to claim 1,
wherein, in the estimating, a state of health (SOH) is further estimated using the model and the measurement information, the SOH being a value indicating the degradation state,
the degradation state estimating method further comprises storing the estimated SOH in a storage unit, and
in the controlling,
a first SOH stored in the storage unit is compared with a second SOH estimated in the estimating subsequent to the first SOH,
when the second SOH is greater than the first SOH, a control for decreasing the length of the duration is performed, and
when the second SOH is less than the first SOH, a control for increasing the length of the duration is performed.

5. The degradation state estimating method according to claim 1, further comprising:
obtaining an instruction value which defines a current value of a charge and discharge current which is a current required for charging and discharging of the secondary battery; and
determining, based on a time constant for a voltage change in the secondary battery, a threshold for a period for determining the duration,
wherein, in the controlling,
(i) the current value of the charging and discharging current of the secondary battery is determined as a current value of the current to be applied to the secondary battery, based on the instruction value obtained in the obtaining of an instruction value, and a period during which the current value of the charging and discharging current is maintained is determined as the duration, based on the threshold determined in the determining of a threshold, and
(ii) charging and discharging of the secondary battery is controlled at the determined current value of the current and over the determined duration,
in the obtaining of at least a voltage value, at least a voltage value of the secondary battery is obtained as the measurement information, the voltage value of the secondary battery being measured while charging and discharging of the secondary battery is being controlled in the controlling, and
in the controlling, the length of the duration is determined to exceed the threshold.

6. The degradation state estimating method according to claim 5,
wherein, in the obtaining of an instruction value, the instruction value is obtained for each first period,
in the controlling, when the threshold is less than the first period, a length of the first period is determined as the length of the duration, and
when the threshold is greater than or equal to the first period, the length of the duration is determined to be greater than or equal to the threshold.

7. The degradation state estimating method according to claim 5,
wherein, in the controlling, a plurality of sets are further determined based on an amount of change, made in a second period, in a plurality of the instruction values which are obtained in the second period, each of the sets including the current value of the current and the duration.

8. The degradation state estimating method according to claim 7,
wherein, in the controlling, the sets are determined such that an amount of change, made in the second period, in current values of the charging and discharging current determined by the instruction values obtained in the second period is equal to an amount of change, made in the second period, in current values of the charging and discharging current in the sets determined according to the instruction values.

9. The degradation state estimating method according to claim 8,
wherein, in the controlling, the current value is determined such that an area obtained by integrating a differential waveform in the second period approaches 0, the differential waveform being a difference between a waveform indicating a plurality of the instruction values obtained consecutively in a predetermined period and a waveform indicating a plurality of the current values to be determined according to the instruction values.

10. The degradation state estimating method according to claim 5,
wherein in the controlling, when a difference between a first current value and a second current value is less than a predetermined reference value, the first current value and the second current value are determined such that the difference is greater than or equal to the predetermined reference value and a sum of the first current value and the second current value is less than the predetermined reference value, the first current value and the second current value being current values of the current to be determined consecutively.

11. A degradation state estimating apparatus which estimates a degradation state of a secondary battery, the degradation state estimating apparatus comprising:
a storage unit in which a model for estimating the degradation state of the secondary battery is stored;
a controlling unit configured to control application of a current to the secondary battery;
a measuring unit configured to obtain, as measurement information, at least a voltage value of the secondary battery measured while the current is flowing through the secondary battery;
an estimating unit configured to estimate the degradation state of the secondary battery, based on the model and the measurement information obtained by the measuring unit; and
an information obtaining unit configured to obtain degradation information which is information indicating a provisional degradation state of the secondary battery,
wherein, in the control, as degradation of the secondary battery indicated by the degradation information progresses, the control unit is configured to perform a second control for increasing a length of duration during which the current to be applied to the secondary battery is maintained at a predetermined current value.

12. A secondary battery system comprising:
a controlling apparatus which includes the degradation state estimating apparatus according to claim 11;
a secondary battery; and
a charge and discharging apparatus which controls charging and discharging of the secondary battery, based on the duration determined by the controlling apparatus.

13. A degradation state estimating method of estimating a degradation state of a secondary battery, the degradation state estimating method comprising:
controlling application of a measuring current to the secondary battery;
obtaining, as measurement information, at least a voltage value of the secondary battery measured while the measuring current is flowing through the secondary battery;
estimating the degradation state of the secondary battery, based on a model for estimating the degradation state of the secondary battery and the measurement information obtained in the obtaining, and
obtaining degradation information which is information indicating a provisional degradation state of the secondary battery,
wherein, in the controlling, as degradation of the secondary battery indicated by the degradation information progresses, a first control for decreasing a current value of the measuring current to be applied to the secondary battery is performed.

14. The degradation state estimating method according to claim 13,
wherein, in the obtaining of degradation information, cycle information indicating a total number of times the secondary battery is charged or discharged is obtained as the degradation information, and
in the controlling, the first control is performed as the total number of times the secondary battery is charged or discharged increases.

15. The degradation state estimating method according to claim 13,
wherein, in the obtaining of degradation information, an operating time period of the secondary battery is obtained as the degradation information, and
in the controlling, the first control is performed as a length of the operating time period of the secondary battery increases.

16. The degradation state estimating method according to claim 13,
wherein, in the estimating, a state of health (SOH) is further estimated using the model and the measurement information, the SOH being a value indicating the degradation state,
the degradation state estimating method further comprises storing the estimated SOH in a storage unit, and
in the controlling,
a first SOH stored in the storage unit is compared with a second SOH estimated in the estimating subsequent to the first SOH,
when the second SOH is greater than the first SOH, a control for increasing the current value of the measuring current is performed, and
when the second SOH is less than the first SOH, a control for decreasing the current value of the measuring current is performed.

17. The degradation state estimating method according to claim 13,
wherein, in the controlling, the current value of the measuring current is determined to cause an amount of voltage change in the secondary battery to approach a predetermined reference value.

18. The degradation state estimating method according to claim 13,
wherein, in the controlling, a pulse current is applied to the secondary battery as the measuring current.

19. A degradation state estimating apparatus which estimates a degradation state of a secondary battery, the degradation state estimating apparatus comprising:
a storage unit in which a model for estimating the degradation state of the secondary battery is stored;
a controlling unit configured to control application of a measuring current to the secondary battery;
a measuring unit configured to obtain, as measurement information, at least a voltage value of the secondary battery measured while the current is flowing through the secondary battery;
an estimating unit configured to estimate the degradation state of the secondary battery, based on the model and the measurement information obtained by the measuring unit; and
an information obtaining unit configured to obtain degradation information which is information indicating a provisional degradation state of the secondary battery,
wherein, in the control, as degradation of the secondary battery indicated by the degradation information progresses, the control unit is configured to perform a first control for decreasing a current value of the measuring current to be applied to the secondary battery.

20. A secondary battery system comprising:
a controlling apparatus which includes the degradation state estimating apparatus according to claim 19;
a secondary battery; and
a charge and discharging apparatus which controls charging and discharging of the secondary battery, based on the current value of the measuring current determined by the controlling apparatus.

* * * * *